(12) United States Patent
Ono et al.

(10) Patent No.: US 8,720,046 B2
(45) Date of Patent: May 13, 2014

(54) PRODUCTION SYSTEM GENERAL-PURPOSE CELL

(75) Inventors: Masatoshi Ono, Suwa (JP); Christoph Meyerhoff, Krefeld (DE)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/557,602

(22) Filed: Jul. 25, 2012

(65) Prior Publication Data

US 2012/0285007 A1    Nov. 15, 2012

Related U.S. Application Data

(63) Continuation of application No. 12/035,706, filed on Feb. 22, 2008, now Pat. No. 8,327,531.

(30) Foreign Application Priority Data

Mar. 7, 2007    (JP) .................................. 2007-057798

(51) Int. Cl.
    *B23P 11/00*    (2006.01)

(52) U.S. Cl.
    USPC .............................................. 29/799; 29/822

(58) Field of Classification Search
    USPC ........... 29/429, 430, 431, 468, 559, 783, 791, 29/799, 822, 823, 824; 414/222.01; 901/6, 901/7, 41
    See application file for complete search history.

(56) References Cited

U.S. PATENT DOCUMENTS

| | | | |
|---|---|---|---|
| 4,655,676 A | 4/1987 | Jannborg et al. | |
| 5,353,490 A | 10/1994 | Kukuljan | |
| 5,692,867 A | 12/1997 | Kondo et al. | |
| 5,930,144 A | 7/1999 | Kondo et al. | |
| 6,256,868 B1 | 7/2001 | Sugito et al. | |
| 6,275,743 B1 | 8/2001 | Kondo et al. | |
| 6,415,204 B1 | 7/2002 | Hirabayashi et al. | |
| 6,772,932 B1 | 8/2004 | Halstead | |
| 8,327,531 B2 * | 12/2012 | Ono et al. | 29/783 |
| 2002/0056189 A1 | 5/2002 | Oatridge et al. | |

FOREIGN PATENT DOCUMENTS

| | | | |
|---|---|---|---|
| JP | 06-008078 | | 1/1994 |
| JP | 06-226568 | | 8/1994 |
| JP | 07-232828 | | 9/1995 |
| JP | 07308877 A | * | 11/1995 |
| JP | 09-019831 | | 1/1997 |
| JP | 2000-354919 | | 12/2000 |
| JP | 3336068 | | 8/2002 |
| JP | 3673117 | | 4/2005 |
| JP | 2006-043844 | | 2/2006 |
| JP | 2007-044840 | | 2/2007 |

OTHER PUBLICATIONS

Translation of Japanese reference Tanaka et al. (JP 07308877 A).*

* cited by examiner

*Primary Examiner* — Jermie Cozart
(74) *Attorney, Agent, or Firm* — Harness, Dickey & Pierce, P.L.C.

(57) ABSTRACT

In a production system general-purpose cell for general-purpose use in processing and transportation of a received workpiece in a production system of processing and delivering the workpiece, the production system general-purpose cell includes a base unit having a planar shape of quadrangle and supporting at least a robot for use in transportation of the workpiece such that the robot is movable on the planar area of quadrangle, a parts supply unit for supplying parts of the workpiece to the robot supported by the base unit, and a processing area extending outside the base unit. The robot supported by the base unit having a motion range set in a range from inside to outside the base unit in a form including at least part of the processing area.

6 Claims, 12 Drawing Sheets

PRODUCTION SYSTEM GENERAL-PURPOSE CELL

CROSS-REFERENCE TO RELATED APPLICATIONS

This application is a continuation of U.S. patent application Ser. No. 12/035,706 filed on Feb. 22, 2008, now U.S. Pat. No. 8,327,531 which claims priority to Japanese Patent Application No. 2007-057798 filed on Mar. 7, 2007, both of which are hereby expressly incorporated by reference herein in their entireties.

BACKGROUND OF THE INVENTION

1. Technical Field

The present invention relates to a production system general-purpose cell and a production system having a line layout using the general-purpose cell.

2. Related Art

Regarding compact electrical products, electronic products, and the like, small batches of a variety of products have increasingly been produced and product cycles have increasingly been reduced in recent years.

Production lines producing the electrical products, electronic products, and the like tend to involve frequent rearrangement of line layouts in accordance with products to be produced.

Since it takes much time and cost to change such production lines in a changeover from production of one product to production of another product, cell production by human hands is used in many cases.

However, automatization of production lines is desired even in such cases from the viewpoints of product quality and production stability.

To address this issue, there has been proposed a system such as that disclosed in Japanese Patent No. 3336068, a first related art example.

In this system, a production system together with a conveyor that transports a workpiece placed on a pallet, which is a holding medium for a workpiece, is configured as assembling cells, as aimed at reduction of losses in time and costs relevant to a line configuration.

That is, this system allows selective supply of parts from a plurality of parts supply devices, which are separately disposed, to each divided cell and causes the cell itself to have a function of machining workpieces suitably for a variety of products to thereby reduce losses in time and costs and promote automatization.

There has been proposed another system such as that disclosed in Japanese Patent No. 3673117, a second related art example.

In this system, a robot placed on a base of a cell (robot unit) that is adjacent to a cell in question with a working bench interposed therebetween is provided, and an assembling tool of the robot as well as parts of a workpiece are transported to the cell in question so that the robot itself attaches and detaches the assembling tool and performs machining operations for the workpiece.

Providing a transportation means that carries in an assembling tool required for of each cell together with parts of a workpiece and carries out the assembling tool after use together with the workpiece machined by the robot, as mentioned just above, further promotes the aforementioned automatization.

On the other hand, there has been still another system such as that disclosed in JP-A-2006-43844, a third related art example, in view of a disadvantage of providing the foregoing robot on the base.

In this system, robots are supported in a state of ceiling-hung by using supporting members provided separately from assembling work benches, and parts supply units that supply parts to movable ranges of the robots are disposed facing the robots.

Supporting the robots in a state of ceiling-hung as mentioned just above allows space on the assembling work benches (bases) to be widely secured, and in turn the degree of freedom relevant to assembling operations on the assembling work benches to be maintained higher.

As described above, various systems have been proposed so as to reduce losses in time and costs required for changes of a line configuration and further promote automatization.

However, from the viewpoints of general versatility as the foregoing cell or the degree of freedom in a line layout, there is still room for improvement.

For example, in the case of a cell or a system described in the first related art example, pallets for holding the aforementioned workpieces need to be prepared by type for various types of workpieces (products) that are production objects.

In implementing the system, a large amount of pallets are therefore needed.

Time and costs required for the design and manufacture cannot be ignored.

In addition, this system is one of transporting the pallets by a conveyor.

Therefore, the system involves a disadvantage in that the production quantity and production capacity of a line are limited by the transportation capacity of the conveyor itself.

In the case of a system described in the second related art example, the foregoing conveyor and the like are unnecessary.

However, the system has a structure in which a robot is placed on a base constituting a cell.

Therefore, restrictions on the operation area required for processing of a workpiece including attachment and detachment of an assembling tool by a robot itself and further restrictions on the size of a tray transported by the foregoing transportation means cannot be ignored.

If a large operation area and a large tray size are secured, upsizing of the entire production system including a cell cannot be avoided.

In a system described in the third related art example, although space on the assembling work benches can be widely secured, the parts supply units are configured to face the assembling work benches.

The degree of freedom of a line layout is limited of itself.

After all, it is difficult to reduce losses in time and costs required for changes in a line configuration.

SUMMARY

An advantage of the invention is to provide a production system general-purpose cell and a production system using the general-purpose cell with which the degree of freedom of a line layout can be maintained high because of high general versatility as the cell, and in turn losses in time and costs in changes of a line layout can be reduced more preferably.

In a production system general-purpose cell according to a first aspect of the invention, as a production system general-purpose cell for general-purpose use in processing and transportation of a received workpiece in a production system of processing and delivering the workpiece, the production system general-purpose cell includes: a base unit having a planar shape of quadrangle and supporting at least a robot for use in transportation of the workpiece such that the robot is movable on the planar area of quadrangle; a parts supply unit for supplying parts of the workpiece to the robot supported by the base unit; and a processing area extending outside the base unit.

The robot supported by the base unit has a motion range set in a range from inside to outside the base unit in a form including at least part of the processing area.

With this structure as a production system general-purpose cell, one general-purpose cell is configured as a set of minimum elements that are required for processing of a workpiece as the cell for a production system, such as a base unit, a parts supply unit, and a processing area.

This, as a matter of course, increases the degree of freedom, that is, the general versatility of task assignment for a cell in question.

It enables achievement of various production functions required for a production system only by placing the cells configured in this way in sequence. That is, the degree of freedom of a line layout in configuring a production system can be maintained high.

In the general-purpose cell, since the foregoing processing area extends outside the base unit and the motion range of the robot provided in the base unit is set in a range from the inside to the outside the base unit in a form including part of the processing area, the application range of the processing area expands of itself.

Including the use, e.g., as an area for manual operations, the processing area can be used for various applications as follows:

(a) the use as an area for placing a specific processing machine that performs required processing for the transported workpiece, (b) the use as an area where a robot itself performs required processing for a workpiece, and the like.

In these cases, parts required for processing of a workpiece are supplied for each cell through the foregoing parts supply unit, and therefore tasks or production functions assigned to the cell in question as a unit are completed for each cell.

In addition, since the planar shape of the base unit itself is quadrangular, the degree of freedom of placing cells in sequence in such a manner as to mutually share the motion range of a robot is maintained high.

The degree of design freedom in arranging the foregoing parts supply unit and processing area to the base unit is also maintained high.

Further, the foregoing robot is movably supported by the base unit in a planar area forming a quadrangle.

This allows effective utilization of an area constituting the base unit, and eliminates unnecessary upsizing of the general-purpose cell.

Note that in the general-purpose cell as described above, the processing area constituting the general-purpose cell may be configured as a separate, replaceable body extending outside the base unit.

In this case, the effect of suppressing transmittance of vibration between the processing area and the base unit can be expected.

In this production system general-purpose cell, such a structure may be employed that a material feed and removal area for use in at least one of feed of the workpiece to a cell in question and removal of the workpiece from the cell in question further extends outside the base unit in a manner of being included in a motion range of the robot.

This production system general-purpose cell enables transportation of workpieces between cells to be performed through the foregoing material feed and removal areas provided in a motion range of the robot 60.

This facilitates feed of workpieces to the general-purpose cell 100 and removal of the workpieces from the general-purpose cell by a so-called bucket-brigade method.

In this production system general-purpose cell, it is preferable that a side wall standing upright to the base unit be provided separately from the processing area in the base unit, and the robot be supported by the base unit in such a manner that the robot protrudes from the side wall.

As with this production system general-purpose cell, as one example of such a supporting manner that the foregoing robot is movably supported by the base unit in a planar area of quadrangle, the robot is supported in such a manner that the robot protrudes from the side wall configured in this way in the base unit.

This facilitates securing an area required for the base unit, and particularly securing a motion range of a robot on a side of the foregoing processing area.

In this production system general-purpose cell, it is preferable that the processing area extend like a table from the base unit with a step at a position higher than the base unit, and the parts supply unit have a tray feeder that transports a parts tray with parts of the workpiece carried thereon from a back surface side of the side wall through the base unit to a lower portion of the processing area structured like a table.

With this production system general-purpose cell, parts carried on the parts tray to be supplied can be transported through the base unit to a lower portion of the processing area, that is, a position lower than the processing area by the tray feeder.

This allows operations such as operations of picking up the parts by the robot protruding from the side wall of the base unit and operations of transporting the picked-up parts to the processing area by the robot to be carried out more smoothly, and also allows the whole of the table-like processing area to be utilized more effectively.

On the other hand, in this production system general-purpose cell, it is preferable that a ceiling supported through a support be provided in an upper portion of the base unit, and the robot be supported by the base unit in a manner of being hung from the ceiling.

As with this production system general-purpose cell, as another example of such a supporting manner that the foregoing robot is movably supported by the base unit in a planar area of quadrangle, the robot is supported in such a manner that the robot is hung from a ceiling.

This allows the motion range of the robot to cover a wide range including the whole area below the ceiling.

In particular, an area constituting the base unit is utilized more effectively.

In this production system general-purpose cell, it is particularly preferable to employ as the foregoing robot a selective compliance assembly robot arm (SCARA) type robot including first and second arms each having a motion area of one of a circle and a circular arc, the second arm being passable through a position overlapping the first arm.

With this production system general-purpose cell, the robot has first and second arms that basically have motion areas of a circle or a circular arc and each pass mutually overlapping positions.

This enables the motion range of the entire robot to be basically in a circle or a circular arc and efficiently cover the required area in the motion range of the robot set inside the circle or the circular arc, that is, from inside to the outside the base unit with the collaboration of the first and second arms.

In this production system general-purpose cell, it is more preferable that the parts supply unit supply a part for the workpiece to a vicinity of the processing area.

If the robot is supported in such a manner that it is hung from the ceiling, there is basically no portion to block the supply of parts by the parts supply unit.

Accordingly, the degree of freedom in arrangement of the parts supply unit is maintained high as a matter of course.

As with this production system general-purpose cell, the parts supply unit may be one that can transport parts to a vicinity of the processing area.

Even with this, operations of picking up appropriate parts by the robot and operations of transporting the picked-up parts to the processing area by the robot are carried out smoothly.

In addition, in this case, the motion range of the robot broadly covers the transportation area of the parts supply unit that transports parts to the base unit.

This therefore allows reduction of the frequency of operations required for supplying parts by means of the foregoing parts supply unit tray, e.g., by upsizing the parts supply unit itself.

On the other hand, in this production system general-purpose cell, it is also preferable to employ a structure in which the cell itself that includes the parts supply unit disposed in the base unit and the processing area has a planar shape of quadrangle.

With this production system general-purpose cell, the quadrangular planar shape of the cell itself including the parts supply unit and the processing area enables, even in the case of using a plurality of general-purpose cells, uniform decision of arrangement of the plurality of general-purpose cells.

This in turn facilitates design of a line layout as the production system.

On the other hand, in this production system general-purpose cell, when a specific processing machine for processing the workpiece is disposed in the processing area, functions of the cell may be set such that the robot carries out operations of:
  a. transportation of the workpiece to the processing area;
  b. picking up of a part supplied through the parts supply unit;
  c. integration of the picked-up part into the workpiece; and
  d. delivering the workpiece processed by the processing machine.

This production system general-purpose cell embodies a manner of using a processing area exemplified in the aforementioned (a).

That is, in this case, processing of the workpiece is specifically performed by the processing machine placed in the processing area.

Therefore, even if a production system is configured in a sequence of the cells, the robot disposed in the base unit only has to repeatedly carry out operations of the aforementioned a to d.

Standardization of the general-purpose cell mentioned above is thus promoted, and the general versatility is maintained very high.

In this production system general-purpose cell, functions of the cell may be set such that the robot carries out operations of:
  a. transportation of the workpiece to the processing area;
  b. picking up of a part supplied through the parts supply unit;
  c. integration of the picked-up part into the workpiece;
  d. processing of the workpiece having the part integrated therein in the processing area; and
  e. delivering the workpiece processed in the processing area.

This production system general-purpose cell embodies a manner of using a processing area exemplified in the aforementioned (b).

In this case, the above operations a to e, that is, all operations to be carried out for the cell in question are carried out by means of the robot disposed in the base unit.

Therefore, if a production system is configured in a sequence of the cells, the content of processing for the robot to carry out needs to be set (programmed) for each cell.

However, if the set content is registered into a storage device such as the data base in advance, changes, e.g., in line configuration can be handled by updating the set content for each cell.

The required general versatility is maintained in this case.

Further, in this production system general-purpose cell, when an automatic tool changer with which the robot automatically replaces a hand of itself with a new one is placed, functions of the cell may be set such that the robot carries out operations of:
  a. picking up of a part supplied through the parts supply unit;
  b. integration of the picked-up part into the workpiece;
  c. processing of the workpiece having the part integrated therein;
  d. delivering the processed workpiece; and
  e. automatic replacement of a robot hand as needed for the operations of a to d by means of the automatic tool changer.

This production system general-purpose cell embodies a still another manner of using a processing area.

In this case, the above operations a to e, that is, all operations to be carried out for the cell in question are basically carried out by means of the robot disposed in the base unit.

Particularly in this case, automatic replacement of a robot hand, as needed, by means of the automatic tool changer provided in the processing area is carried out as the operation of the above e together with other operations, and therefore more kinds of operations can be handled.

In this case, when a production system is configured in a sequence of the above cells, the content of processing for the robot to carry out needs to be set (programmed) for each cell.

However, the general versatility required as the cell in question is preferably maintained by registering in advance the set content into a storage device and the like.

In a production system using a general-purpose cell according to a second aspect of the invention, such a structure is employed that a plurality of the production system general-purpose cells as described above arranged in such a manner that the cells adjacent to each other share part of the motion range of the robot.

It has been described above that a production system general-purpose cell, which is used here, itself is configured as a set of minimum elements that are required for processing of a workpiece as the cell for a production system, such as a base unit, a parts supply unit, and a processing area, and the degree of freedom, that is, the general versatility of task assignment for the cell is greatly increased.

Therefore, with a production system according to the second aspect of the invention in which a plurality of production system general-purpose cells as described above arranged in such a manner that the cells adjacent to each other share part of the motion range of the robot, pallets, conveyer belts, and the like for transporting a workpiece are, of course, unnecessary, and a high degree of freedom of a line layout itself is maintained.

This therefore enables achievement of a very free line layout, such as a linear arrangement of the cells and an arrangement of a line bent in the middle by ±90° to form an "L" shape or a "U" shape in accordance with a space for placing this production system, and the like, and what is more, at low costs.

In this production system, it is preferable to further include a workpiece automatic transportation unit that automatically transports a workpiece so as to enable, between such the cells that motion ranges of robots in the cells are mutually unreachable, transferring and receiving of the workpiece within the motion ranges of the robots.

This production system allows a more wide variety of line layouts such as making part or the whole of a line in a parallel manner using the foregoing workpiece automatic transportation units, in addition to the line layouts described above, and also facilitates adjustment of the line speed and adjustment of the transportation timing in accordance with processing contents of workpieces between cells.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described.
First Embodiment

Description will be given below on a first embodiment that implements a production system general-purpose cell and a production system using the general-purpose cell according to the invention, with reference to the drawings.

Figure 1:
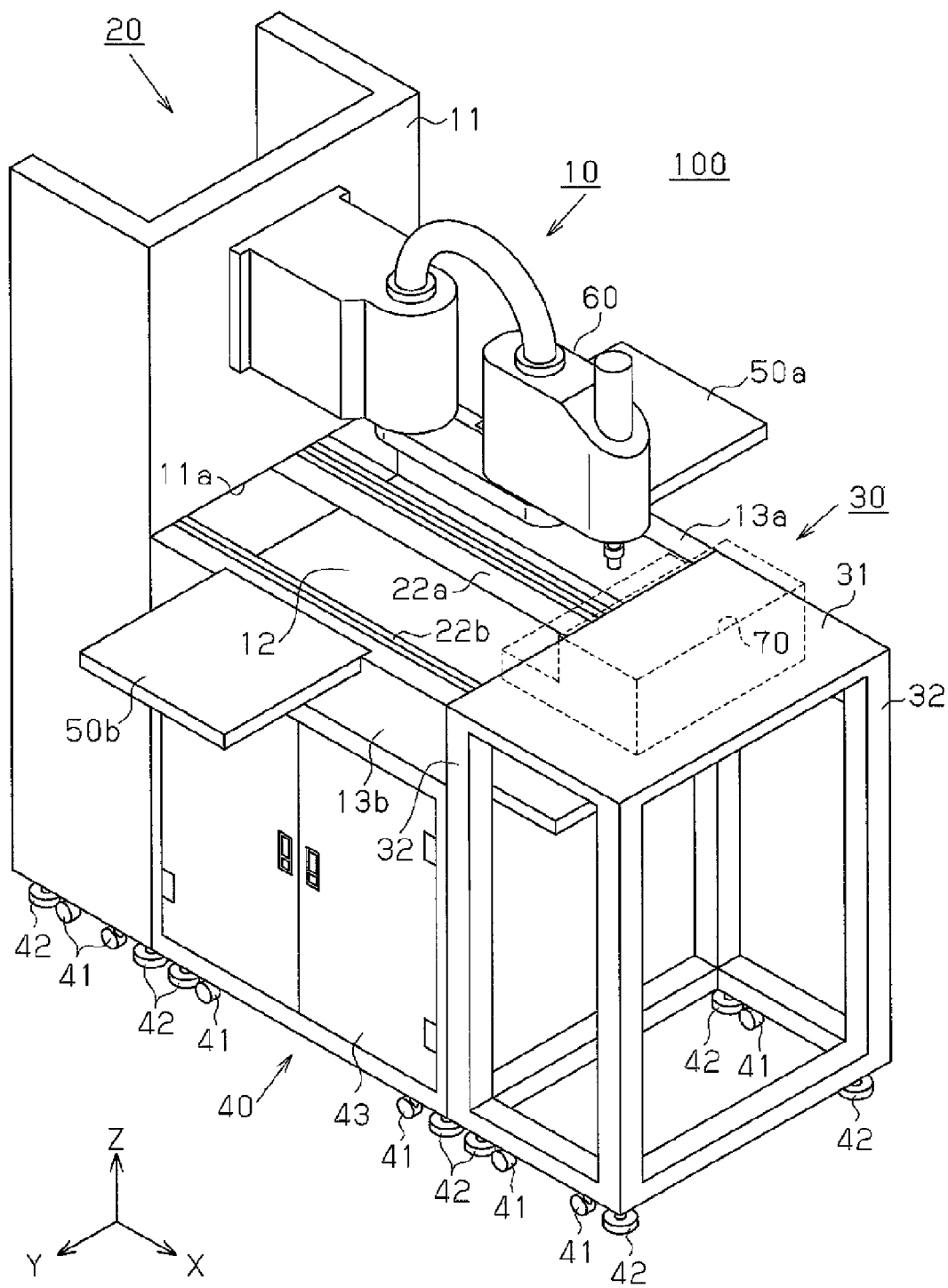
FIG. 1 is a perspective view illustrating an entire perspective configuration of first embodiment of a production system general-purpose cell according to the invention.

FIG. 1 illustrates an entire perspective configuration of a production system general-purpose cell according to the first embodiment.

As illustrated in FIG. 1, a general-purpose cell 100 includes a base unit 10, which supports a robot 60, positioned at the center, and a parts supply unit 20 and a processing area 30 both disposed in a row along the direction of the X axis of three dimensional coordinates added in the figure.

In the present embodiment, the base unit 10, the parts supply unit 20, and the processing area 30 constituting the general-purpose cell 100 are all made of metal having rigidity and are mutually suitably connected, and can be moved and placed in blocks of cell by using casters 41 and foot jacks 42 attached onto a bottom surface 40 of the general-purpose cell 100.

In other words, the general-purpose cell 100 can be moved in any direction on the floor surface by using the casters 41 on the bottom surface 40, and can also be fixed to a desired position by using the foot jacks 42 on the bottom surface 40.

Additionally, in the embodiment, the planar shape of the base unit 10 and the general-purpose cell 100 itself are quadrangular (rectangular).

Such shapes facilitate design of a line layout for a production system using a plurality of general-purpose cells 100.

In the general-purpose cell 100, a cabinet 43 is disposed in a lower portion of the base unit 10.

In the cabinet 43, a control device, which supervises and controls the foregoing robot 60 and other units of the general-purpose cell 100, and the like are contained.

Here, the specific configuration of the above base unit 10 will be first described.

As illustrated in FIG. 1, in the base unit 10, a side wall 11 standing upright to the base unit 10 is disposed on the side of the boundary with the parts supply unit 20, and the aforementioned robot (SCARA type robot in this example) 60 is supported in such a form that the robot 60 protrudes from the side wall 11 toward the processing area 30.

That is, the robot 60 is supported by the base unit 10, accurately against the side wall 11, in such a manner as to be movable in the X, Y, and Z axis directions of three dimensional coordinates on a region 12 having a planar shape of quadrangle, which is a top surface of the base unit 10.

In the embodiment, a material supply area 50a serving as a unit of supplying a workpiece to a cell 100 in question and a material removal area 50b serving as a unit of removing the workpiece from the cell 100 in question extend from side plates 13a and 13b, respectively, disposed on both sides of the region 12 to both sides (Y direction) of the base unit 10 in such a manner so as to be within the motion range of the robot 60 described above.

Figure 2:
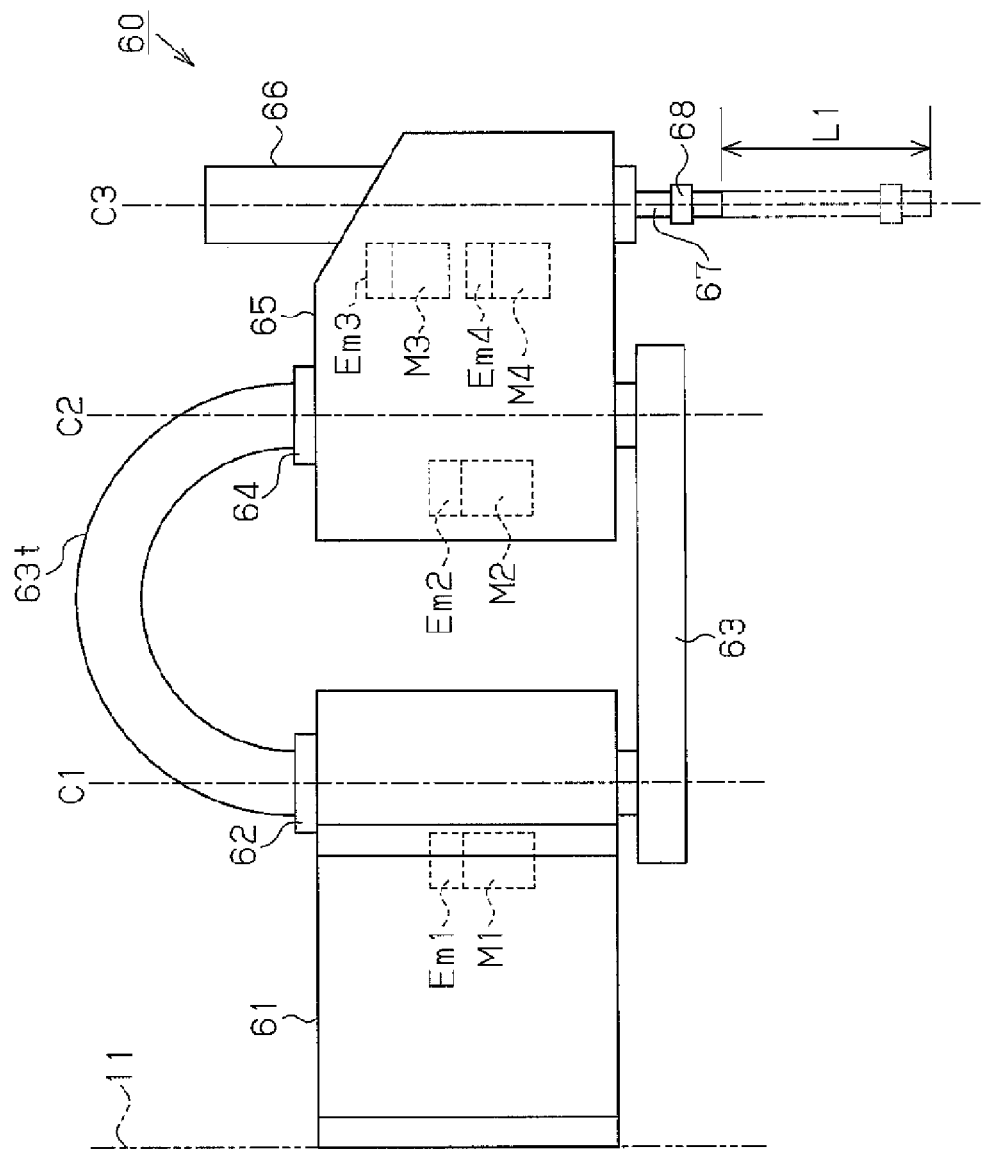
FIG. 2 is a side view illustrating a side configuration of a robot employed for the general-purpose cell of the embodiment.

FIG. 2 illustrates a side configuration of the robot 60, and further details of the configuration and functions of the robot 60 are described in the following with reference to FIG. 2.

As illustrated in FIG. 2, the robot 60 is supported by a base 61 extending from the side wall 11 mentioned above into the X direction in the figure, and has a first arm 63 and a second arm 65 that are separately rotatable in a horizontal direction (X-Y direction in the figure) through a first shaft 62 and a second shaft 64, respectively.

In an edge of the second arm 65 among these components, a third shaft 66 extending in the same direction (Z direction in the figure) as those of the first and second shafts 62 and 64 is further provided. In the third shaft 66, a head unit 67, which is rotatable in a horizontal direction independently from the turn of the second arm 65, is disposed in a portion positioned below the second arm 65.

The head unit 67 has, in an edge thereof, a tool fixture 68.

With an arbitrary tool attached to the tool fixture 68, the head unit 67 can freely expand and contract between a position where it is contained in the third shaft 66 (the shortest position) and a position where it extends for a distance L1 indicated by a dotted line in FIG. 2 (the longest position).

Note that the first shaft 62 rotates right and left around a center line C1 of a first motor M1, which is disposed in the base 61, by the first motor M1 to cause the first arm 63 with a base portion connected to the first shaft 62 to turn.

The rotation angle of the first shaft 62, that is, the turning angle of the first arm 63 is monitored through a first encoder Em1 disposed, like the first motor M1, in the base 61.

The second shaft 64 causes the second arm 65 to turn.

That is, the second shaft 64 is connected to an edge of the first arm 63, and when forces are applied to the second shaft 64 by a second motor M2 disposed in the second arm 65 so that the second shaft 64 rotates right and left around a center line C2 of the second motor M2, the reaction forces act on the second arm 65 itself to cause the second arm 65 to turn.

The rotation angle of the second shaft 64, that is, the turning angle of the second arm 65 is monitored through a second encoder Em2 disposed, like the second motor M2, in the second arm 65.

The head unit 67 that rotates, expands and contracts in the third shaft 66 rotates right and left around a center line C3 of the third shaft 66 by a third motor M3 disposed in the second arm 65, and the rotation angle is monitored through a third encoder Em3 disposed, like the third motor M3, in the second arm 65.

On the other hand, regarding expansion and contraction of the head unit 67, the degree of the expansion and contraction is controlled by an elevating motor M4 disposed in the second arm 65, and the controlled degree is monitored through an elevating encoder Em4 disposed, like the elevating motor M4, in the second arm 65.

Signal lines of control signals and monitor signals of these motors and encoders disposed in the second arm 65 are collected through a flexible wiring tube 63t into the base 61, and then are coupled together with signal lines of the first motor M1 and the first encoder Em1 from the base 61 to the corresponding terminals of a control device contained in the cabinet 43.

Figure 3:
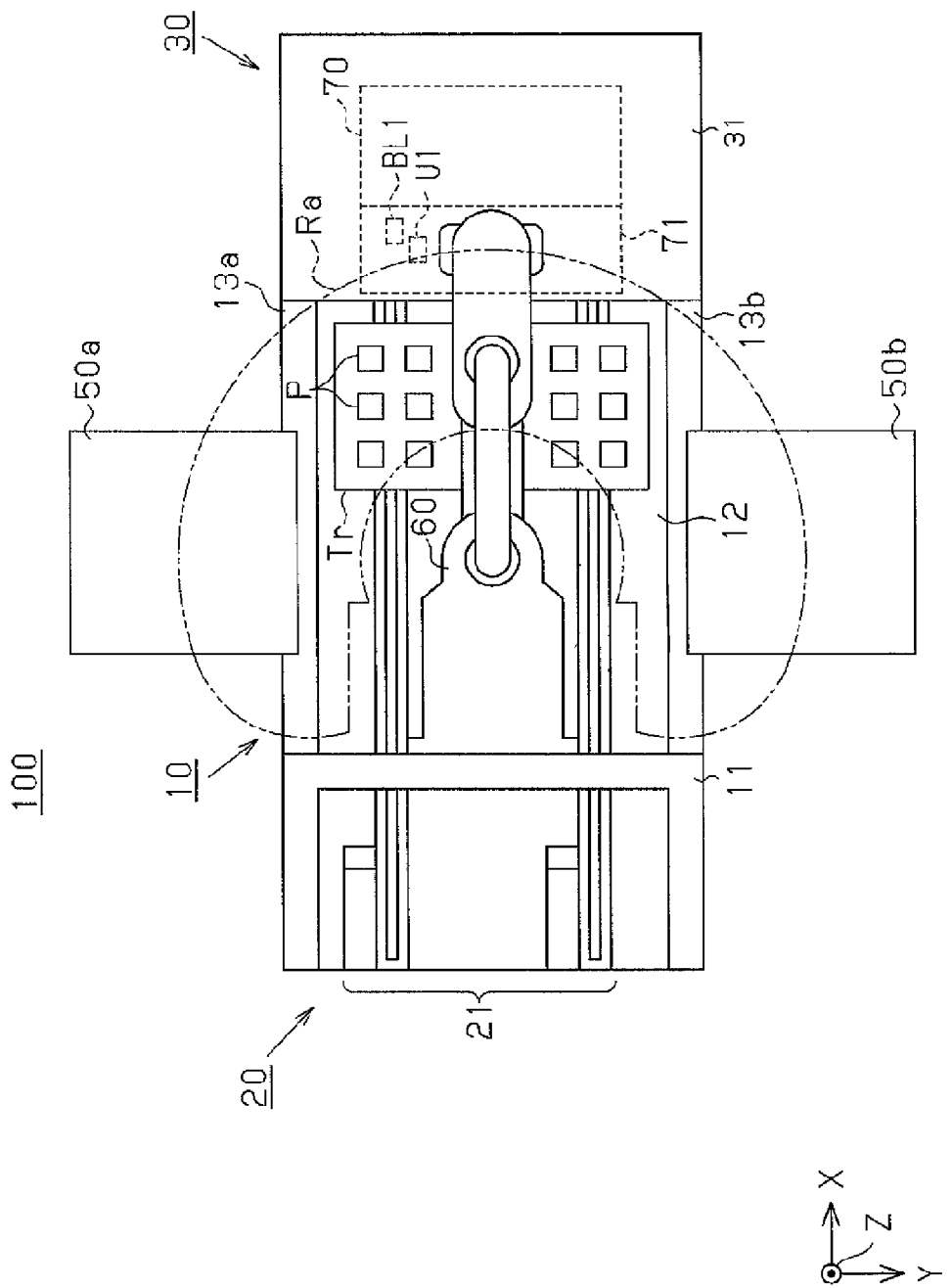
FIG. 3 is a plan view illustrating an entire planar configuration of the general-purpose cell of the embodiment.

FIG. 3 illustrates a planar configuration of the general-purpose cell 100 including a parts tray Tr, which is omitted in FIG. 1 for convenience.

In the general-purpose cell 100, such a motion range of the robot 60 is set to one illustrated as a region Ra (indicated by an alternate long and two short dashes line) in FIG. 3, that is, a range from the inside to the outside the base unit 10 in a form including part of the processing area 30.

In this way, picking up of parts from the parts tray Tr supported through the parts supply unit 20 to be described below and other operations such as transportation (movement) of a workpiece between the material supply area 50a, the material removal area 50b, and the processing area 30 can be easily achieved with high general versatility.

Figure 4:
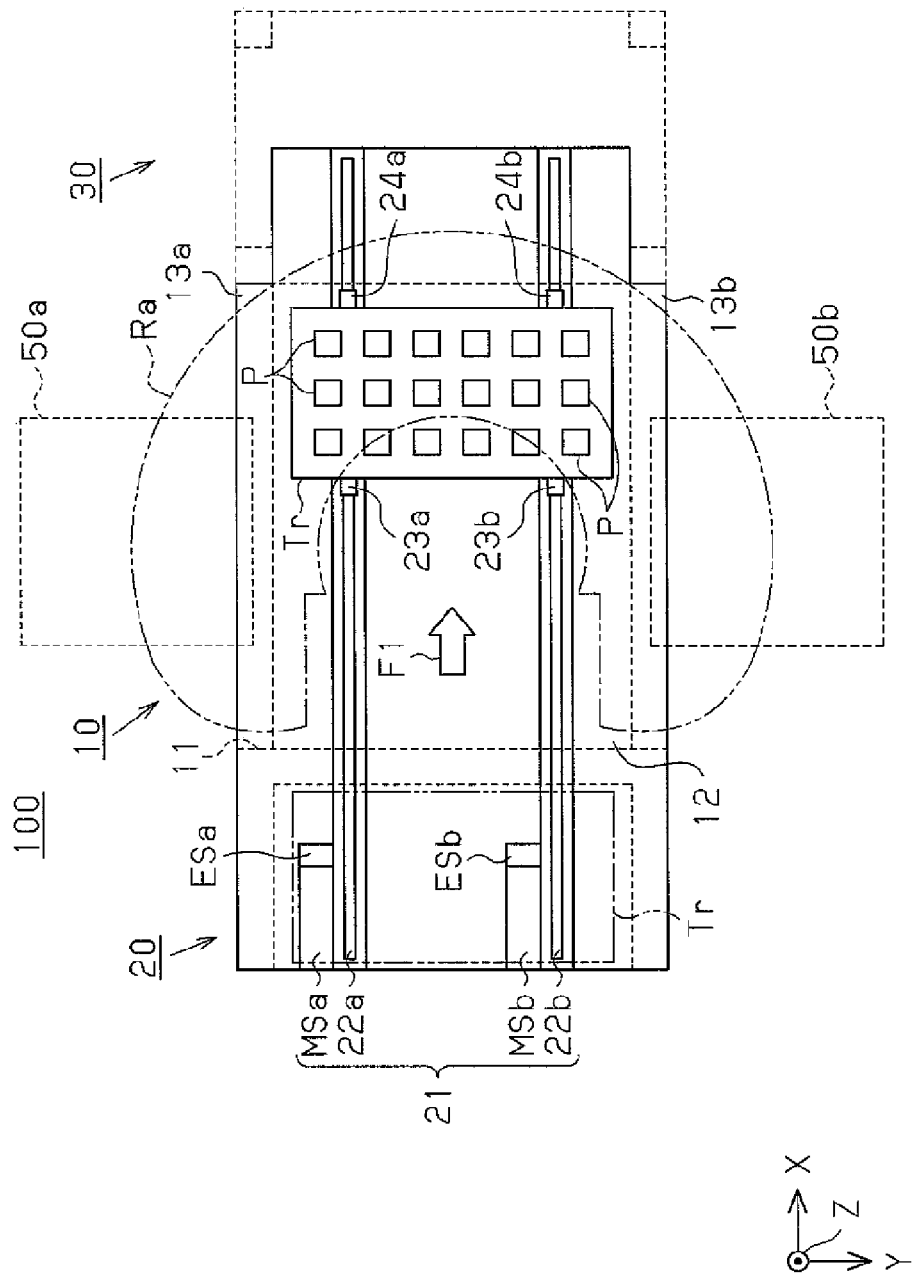
FIG. 4 is a plan view illustrating a planar configuration of the general-purpose cell 100 with a focus on a parts supply unit 20 employed for the general-purpose cell of the embodiment.

Like FIG. 3, FIG. 4 illustrates the planar configuration of the general-purpose cell 100.

FIG. 4 particularly illustrates it with a focus on the planar configuration of the parts supply unit 20 mentioned above.

In the following, the configuration and functions of the parts supply unit 20, and further its relation with the processing area 30 will be described in detail with reference to FIG. 4.

As illustrated in FIG. 4, the parts supply unit 20 includes a pair of rails 22a and 22b laid on the region 12 having a quadrangular planar shape, which is the top surface of the base unit 10, and a tray feeder 21 that automatically transports the parts tray Tr having a pocket P for carrying parts in the X direction in the figure through the rails 22a and 22b.

Here, inside each of the pair of rails 22a and 22b, ball screws (not illustrated) are arranged over the whole rail, and nails 23a and 23b and nails 24a and 24b threadably engaged with the ball screws before and after the parts tray Tr.

That is, the tray feeder 21 automatically transports, as needed, the parts tray Tr together with the nails 23a and 23b and nails 24a and 24b threadably engaged with the ball screws through the rotation of the ball screws in the X direction in the figure.

Note that, in the tray feeder 21, the rotary drive of such ball screws are carried out by first and second shuttle motors MSa and MSb disposed in a base portion of the tray feeder 21.

The amounts of rotation of the first and second shuttle motors MSa and MSb, that is, the amount of movement of the parts tray Tr is monitored through first and second shuttle encoders ESa and Esb disposed, like the first and second shuttle motors MSa and MSb, in the base portion of the tray feeder 21.

Signal lines of the shuttle motors and shuttle encoders, like the signal lines of motors and encoders of the robot 60, are coupled to the corresponding terminals of a control device contained in the cabinet 43.

As illustrated in FIG. 1 referenced above, the pair of rails 22a and 22b are laid via an opening 11a of the side wall 11, which is formed in a planar shape of "U" to maintain high rigidity.

That is, the pair of rails 22a and 22b are laid from the back surface side of the side wall 11 through the base unit 10 to a lower portion of the processing area 30 structured like a table.

The parts tray Tr carrying thereon parts needed on the back surface side of the side wall 11, which is indicated by an alternate long and two short dashes line in FIG. 4, is automatically transported to a desired position in such a manner as indicated by an arrow F1 in FIG. 4 by the tray feeder 21, as needed.

In this way, the parts tray Tr can be transported to a position lower than the processing area 30 structured like a table.

This causes operations of picking up parts by the robot 60, operations of transporting the picked-up parts to the processing area 30 by the robot 60, and the like to be smoothly carried out.

This also allows the transportation positions of the parts tray Tr (supply positions of the tray feeder 21) to be sequentially adjusted so as to supplement the limited motion range of the robot 60 while effectively utilizing the whole of the table-like processing area 30 at all times.

On the other hand, the processing area 30 extends in a table shape from the base unit 10 with a step at a position higher than the base unit 10, accurately the region 12 having a quadrangular planar shape, which is the top surface of the base unit 10, as illustrated in FIG. 1 referenced above.

In addition, the processing area 30 has a configuration where a table-like stage 31 is supported by legs 32.

Particularly in the embodiment, placed on the stage 31 is a processing machine 70 that performs processing specifically assigned for each cell for a workpiece.

The processing machine 70 itself may be configured arbitrarily, e.g., employing a dedicated robot.

However, at least the processing machine 70 as mentioned above is placed on the stage 31 in the processing area 30.

As a result, the general-purpose cell 100 only has to basically transport a workpiece and pick up its parts through the robot 60.

This promotes standardization of the operations of the general-purpose cell 100.

Note that a workpiece holding area 71 for holding a transported workpiece is provided in the processing machine 70 as illustrated in FIG. 3.

In the workpiece holding area 71, a chuck (not illustrated) for holding a workpiece is provided.

The chuck is opened and closed by the drive of a switching valve BL1 provided in the workpiece holding area 71.

Through this chuck, whether or not a workpiece is held is monitored through a sensor U1.

Like the above signal lines of motors and encoders of the robot 60 and further the above signal line of shuttle motors and shuttle encoders of the tray feeder 21, signal lines of these valve and sensor are coupled to the corresponding terminals of a control device contained in the aforementioned cabinet 43.

Here, referring to FIG. 5, the electrical construction of the general-purpose cell 100 will be described with a central focus on the aforementioned control device.

Figure 5:
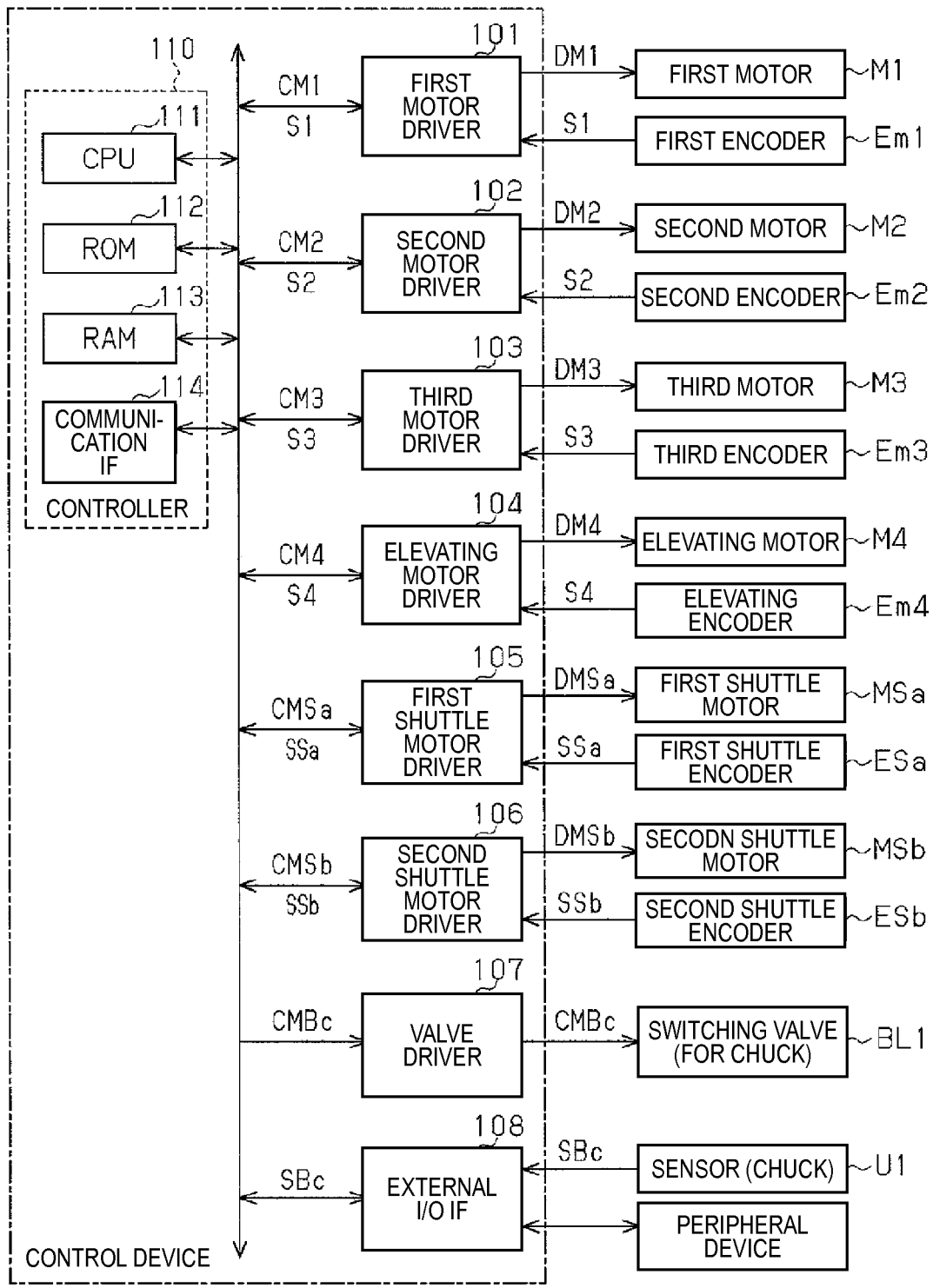
FIG. 5 is a block diagram illustrating an electrical construction of the general-purpose cell of the embodiment.

As illustrated in FIG. 5, the control device contained in the cabinet 43 basically includes a controller 110 that is made of a computer and supervises and controls each unit, and various driver circuits and interface circuits bus-coupled to the controller 110.

Among these units, the controller 110 is a unit that carries out a program stored on a ROM 112 through a CPU 111 while taking in the aforementioned various monitor signals, thereby generating and outputting control signals for each actuator concerned.

Note that operation results and the like in generating the above taken-in monitor signals and the above control signals are temporarily stored on a RAM 113, which is a data memory.

A communication interface (IF) 114 is a unit that communicates with a central controller serving as a main control device and other general-purpose cells in making a desired line layout by arranging a plurality of general-purpose cells 100 as a production system.

Based on information through such the communication IF 114, timely adjustment with other general-purpose cells is achieved.

For such convenience in communications, each general-purpose cell is provided with a unique identifier (ID) for the controller 110 in a system.

On the other hand, various driver circuits and interface circuits that are bus-coupled to the controller 110 are circuits as described in the following.

First, a first motor driver 101 is a circuit that drives the first motor M1 provided in the base 61 of the robot 60 by drive signals DM1 generated based on a control command CM1 from the controller 110.

The first motor driver 101 takes in signals monitored through the first encoder Em1 provided, like the first motor M1, in the base 61, that is, signals S1 representing a rotation angle of the first arm 63 corresponding to the amount of drive of the first motor M1, and also carries out operations of transmitting the taken-in monitor signals S1 to the controller 110.

A second motor driver 102 is a circuit that drives the second motor M2 provided in the second arm 65 of the robot 60 by drive signals DM2 generated based on a control command CM2 from the controller 110.

The second motor driver 102 takes in signals monitored through the second encoder Em2 provided, like the second motor M2, in the second arm 65, that is, signals S2 representing a rotation angle of the second arm 65 corresponding to the amount of drive of the second motor M2, and also carries out operations of transmitting the taken-in monitor signals S2 to the controller 110.

A third motor driver 103 is a circuit that drives the third motor M3 provided, like other motors, in the second arm 65 of the robot 60 by drive signals DM3 generated based on a control command CM3 from the controller 110.

The third motor driver 103 takes in signals monitored through the third encoder Em3 provided in the second arm 65, that is, signals S3 representing a rotation angle of the head unit 67 corresponding to the amount of drive of the third motor M3, and also carries out operations of transmitting the taken-in monitor signals S3 to the controller 110.

An elevating motor driver 104 is a circuit that drives the elevating motor M4 provided, like other motors, in the second arm 65 of the robot 60 by drive signals DM4 generated based on a control command CM4 from the controller 110.

The elevating motor driver 104 takes in signals monitored through the elevating encoder Em4 provided in the second arm 65, that is, signals S4 representing the degree of the expansion and contraction of the head unit 67 corresponding to the amount of drive of the elevating motor M4, and also carries out operations of transmitting the taken-in monitor signals S4 to the controller 110.

A first shuttle motor driver 105 is a circuit that drives the first shuttle motor MSa provided in the aforementioned tray feeder 21 by drive signals DMSa generated based on a control command CMSa from the controller 110.

The first shuttle motor driver 105 takes in signals monitored through the first shuttle encoder ESa provided, like other motors, in the tray feeder 21, that is, signals SSa representing the movement amount of the parts tray Tr corresponding to the amount of drive of the first shuttle motor MSa, and also carries out operations of transmitting the taken-in monitor signals SSa to the controller 110.

A second shuttle motor driver 106 is a circuit that drives the second shuttle motor MSb provided in the tray feeder 21 by drive signals DMSb generated based on a control command CMSb from the controller 110.

The second shuttle motor driver 106 takes in signals monitored through the second shuttle encoder ESb provided, like other motors, in the tray feeder 21, that is, signals SSb representing the movement amount of the parts tray Tr corresponding to the amount of drive of the second shuttle motor MSb, and also carries out operations of transmitting the taken-in monitor signals SSb to the controller 110.

A valve driver 107 is a circuit that drives the switching valve BL1 provided in the workpiece holding area 71 of the aforementioned processing machine 70 based on a control command CMBc from the controller 110.

Note that in the embodiment such a type of chuck that opens and closes on the basis of the presence and absence of compressed air supplied is expected for use as a chuck to hold a workpiece in the workpiece holding area 71.

The foregoing switching valve BL1 is designed as such a valve that switches and controls the presence and absence of compressed air based on the drive of the valve driver 107.

An external input/output (I/O) IF 108 is a circuit that is basically coupled with peripheral devices such as a teaching pendant and a personal computer and mediates various information sent and received between the peripheral devices and the controller 110.

In the embodiment, in addition, information monitored through the sensor U1 in the workpiece holding area 71, that is, information SBc representing whether or not a workpiece is held is taken in through the chuck, and operations of outputting the taken-in monitor information SBc to the controller 110 are carried out through the external I/O IF 108.

Further, in the embodiment, the processing machine 70 described above functions as one of peripheral devices and its controller is coupled to the external I/O IF 108.

Synchronizing in operations between the controller 110 and the processing machine 70, and the like are designed to be performed through the external I/O IF 108.

FIGS. 6A to 6D illustrate operation examples of an individual cell of the general-purpose cell 100 having a configuration as described above.

In the following, one example of operations carried out using the general-purpose cell 100 will be described with reference to FIGS. 6A to 6D.

In the embodiment, as a result of placing the specifically assigned processing machine 70 on the stage 31 in the processing area 30, the general-purpose cell 100 only has to basically transport a workpiece and pick up its parts through the robot 60, as described above.

This promotes standardization of the operations of the general-purpose cell 100.

Note that the following operations of such the general-purpose cell 100 should all be carried out in collaboration with the control described above of the control device.

Figure 6A:
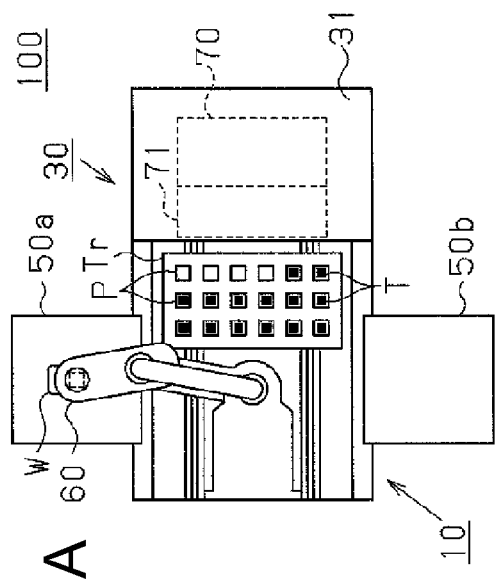
FIGS. 6A to 6D are plan views illustrating operation examples of the general-purpose cell of the embodiment.

That is, if a workpiece W is now supplied to the aforementioned material supply area 50a as illustrated in FIG. 6A, the general-purpose cell 100 moves the robot 60 to the material supply area 50a, and grasps the supplied workpiece W by using an appropriate tool for workpiece transportation that is attached to the robot 60.

Figure 6B:
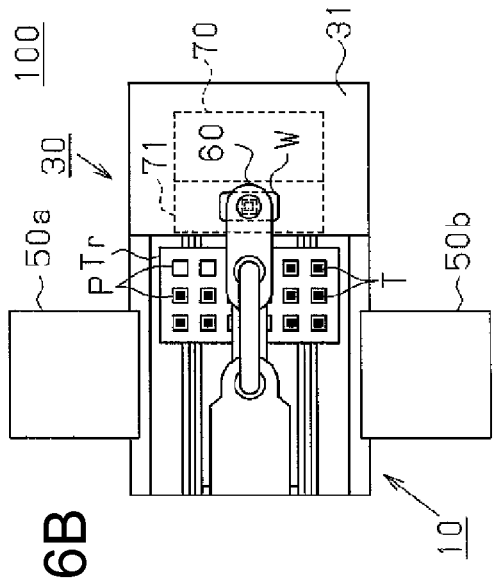

The general-purpose cell 100 that has thus grasped the workpiece W by means of the robot 60 then transports the workpiece W to the processing area 30 while grasping the workpiece W, and sets the transported workpiece W to the workpiece holding area 71 of the processing machine 70 in a manner illustrated in FIG. 6B.

Figure 6C:
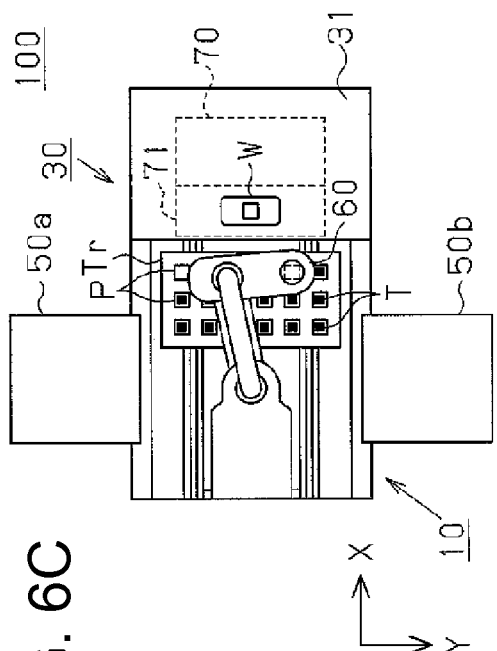

After finishing the setting of the workpiece W to the workpiece holding area 71, the general-purpose cell 100 picks up parts T carried on the pockets P of the parts tray Tr using the robot 60 in a manner illustrated in FIG. 6C.

Note that the parts tray Tr on which the parts T used for processing of the workpiece W are carried has already been transported to a predetermined position by the aforementioned tray feeder 21 (FIG. 4) prior to the process illustrated in FIG. 6A.

At this point, the parts T picked up by the robot 60 in this way are also integrated into the workpiece W set in the workpiece holding area 71 by the robot 60.

After the parts T have been incorporated into the workpiece W in this way, specific processing by the processing machine 70 is performed in accordance with a direction from the controller 110 of the general-purpose cell 100.

When the processing by the processing machine 70 is completed, information on the completion is sent to the controller 110 through the processing machine 70.

With this, the general-purpose cell 100 determines that the processing by the processing machine 70 has been completed, and releases the holding (setting) of the workpiece W.

Figure 6D:
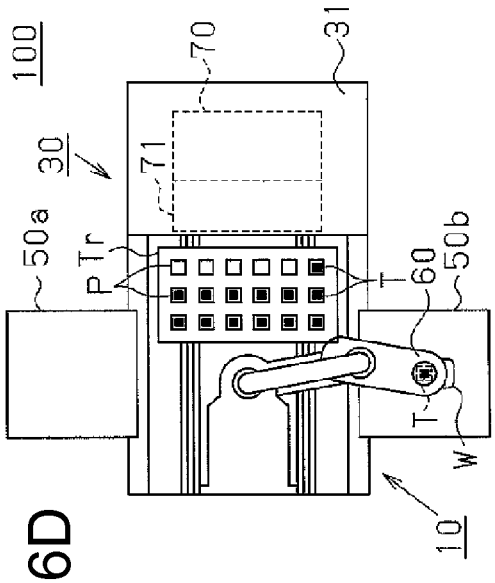

The general-purpose cell 100 that has determined the completion of the processing by the processing machine 70 in this way grasps the processed workpiece W in the workpiece holding area 71 using the robot 60 again, and transports this processed workpiece W to the material removal area 50b in a manner illustrated in FIG. 6D.

Thus a series of operations is completed.

While operations as described above are repeatedly carried out, the position of the parts tray Tr is sequentially shifted forward (in a direction of the processing area 30) by a distance corresponding to an interval of carrying the parts T by the aforementioned tray feeder 21 (FIG. 4) every time one row of the parts T carried on the parts tray Tr has been picked up from the head of the tray Tr by the robot 60.

If it is determined that integration of all the parts T carried on the parts tray Tr has finished, then the parts tray Tr is returned to the position in the base portion indicated by an alternate long and two short dashes line in FIG. 4 by the tray feeder 21, preparing for replenishment of the parts T to the tray.

Figure 7:
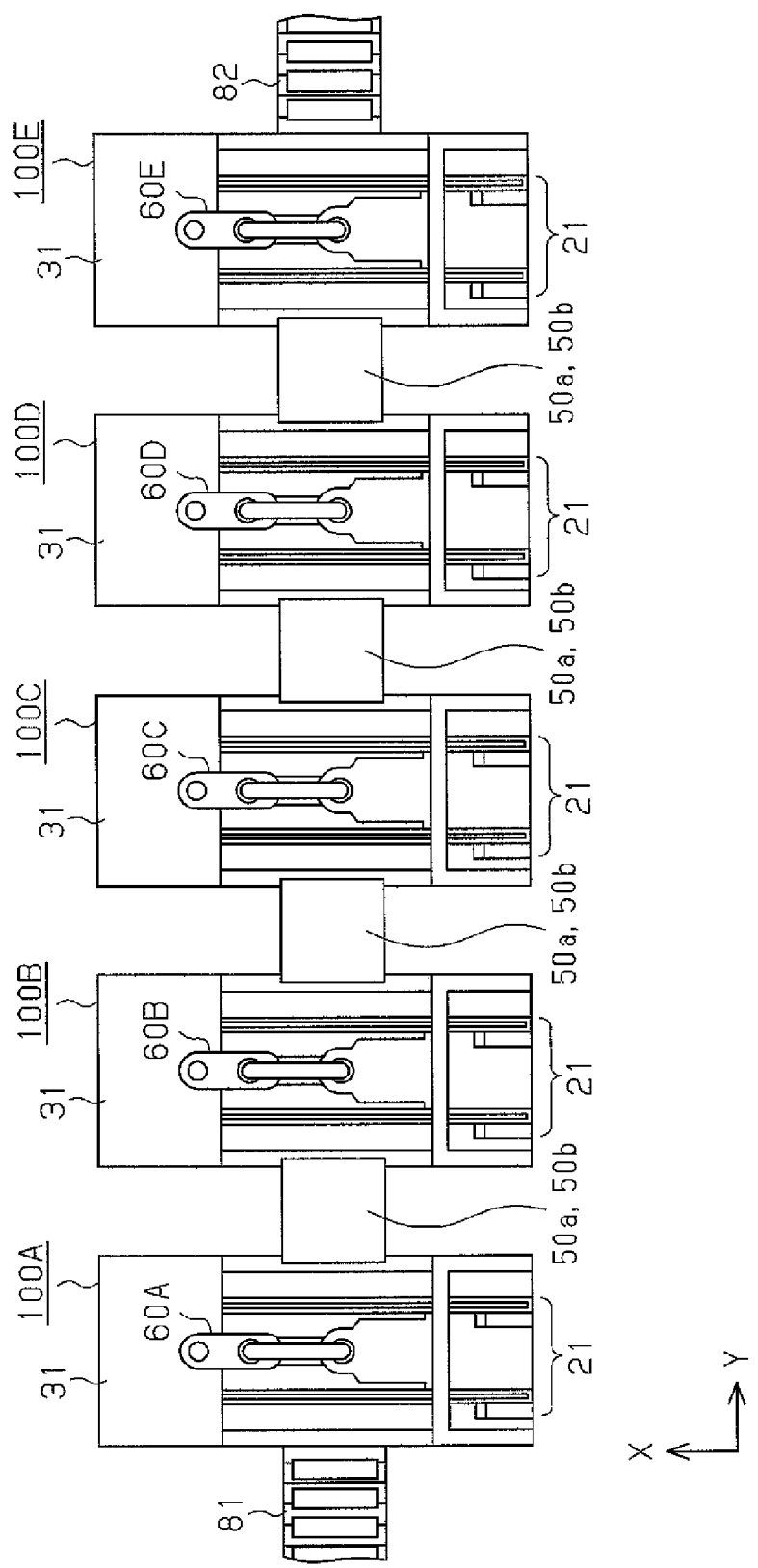
FIG. 7 is a plan view illustrating an example of a line configuration as a production system that uses a plurality of general-purpose cells of the embodiment.

FIG. 7 illustrates one example of a production system that uses a plurality of general-purpose cells 100 as described above (five general-purpose cells 100A to 100E in this example).

A configuration example as such a production system and its possibility will be described below.

As illustrated in FIG. 7, this production system employs a line layout in which the general-purpose cells 100 (100A to 100E) are arranged in a single row in the Y direction in the figure from a workpiece carrying-in device 81 to a workpiece carrying-out device 82.

That is, in this case, the plurality of cells 100A to 100E are arranged in such a manner that the cells adjacent to each other share part of the motion range of the robot 60 (60A to 60E).

As a portion where the cells adjacent to each other share the motion range of the robot 60, either a portion to constitute the aforementioned material supply area 50a or a portion to constitute the aforementioned material removal area 50b is used.

Specifically, for example, a common area 50a or 50b interposed between the general-purpose cells 100A and 100B is used as the material removal area 50b for the cell 100A while being used as the material supply area 50a for the cell 100B.

Figure 8:
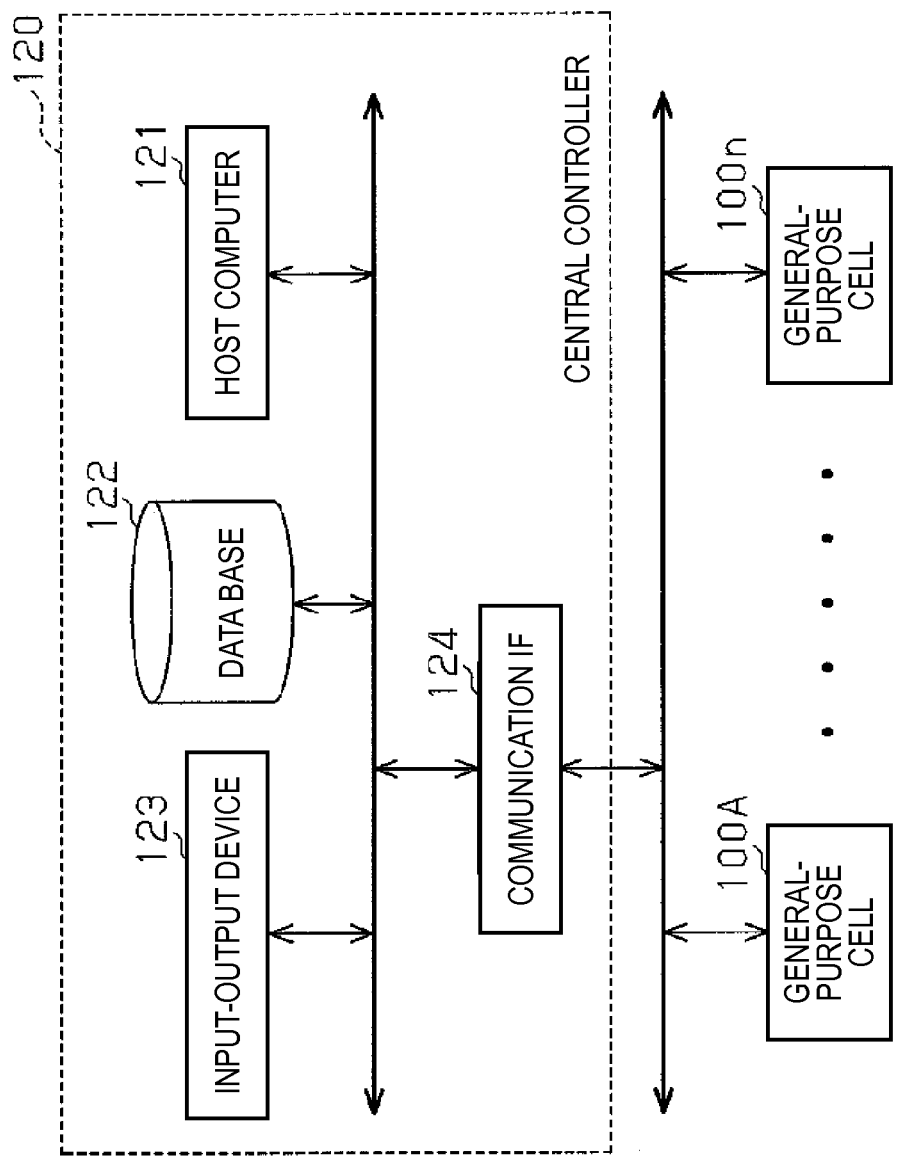
FIG. 8 is a block diagram illustrating an electrical construction as the production system.

FIG. 8 schematically illustrates an electrical construction in the case of a production system (production line) using a plurality of general-purpose cells 100 in this way.

As illustrated in FIG. 8, operation timing and the like are actually synchronized among the plurality of general-purpose cells 100 (100A to 100n (n: natural number)) through communication with the central controller 120, which is not illustrated in FIG. 7.

In addition, in the central controller 120 illustrated in FIG. 8, a host computer 121 is a unit that supervises and controls the entire production system, and a data base 122 is a unit in which e.g., production management information for each of various production objects and control data and control programs of each general-purpose cell 100 required when a production line is changed are stored. An input-output device 123 mainly includes a key board, a display, a printer, and the like.

Through these key board, display, printer, and the like, inputting control information to the host computer 121, displaying the operation state of the entire system, printing, and the like are performed.

The communication IF 124 is a unit that mediates communication between the central controller 120 and each general-purpose cell 100, and is coupled through a bus line to the communication IF 114 disposed in the controller 110 of each general-purpose cell 100 illustrated in FIG. 5 referenced above.

A production system exemplified in FIG. 7 is electrically coupled in this manner such that communication is possible.

This allows processing and transportation for a workpiece to be performed while avoiding interference among the robots 60A to 60E under supervision and control by the foregoing central controller 120, specifically in the following manner.

In other words, if carrying-in of a workpiece for the leading general-purpose cell 100A starts by the workpiece carrying-in device 81, the carried-in workpiece is transported into a stage (processing stage) 31, accurately a workpiece holding area of the processing machine (not illustrated) placed on the stage 31, by the robot 60A as described above in the general-purpose cell 100A.

In a manner described above, after incorporation of parts into the workpiece and processing by a processing machine are performed, the processed workpiece is transported into the material removal area 50b (the material supply area 50a for the cell 100B) by the robot 60A.

Note that processes relevant to carrying in a workpiece by means of the workpiece carrying-in device 81 for the general-purpose cell 100A that has completed the transportation of a workpiece to the material removal area 50b, transporting the workpiece by the general-purpose cell 100A, and processing are repeatedly performed until throwing of a predetermined number of workpieces into the processes is completed.

On the other hand, in the general-purpose cell 100B where a workpiece has been carried into (supplied to) the material supply area 50a, as described above, the carried-in workpiece is transported to the stage 31 by the robot 60B, and after processing is performed by the specific processing machine, the processed workpiece is transported to the material removal area 50b (the material supply area 50a for the cell 100C) by the robot 60B.

Such processes in the cell 100B are also repeatedly performed until carrying-in of workpieces to the material feed area 50b is completed.

Subsequently, the same processes are performed in the general-purpose cells 100C to 10E.

In particular, workpieces transported from the cell 100E at the final stage to the workpiece carrying-out device 82 are sequentially contained as completed products or semi-completed products into storage rack (not illustrated) and the like.

In a production system using a general-purpose cell according to the embodiment as described above, pallets, conveyer belts, and the like for transporting a workpiece are, of course, unnecessary, and a high degree of freedom of a line layout itself is maintained in accordance with arrangement of the material removal area 50b and the material supply area 50a as the common area interposed between cells adjacent to each other.

Figure 9:
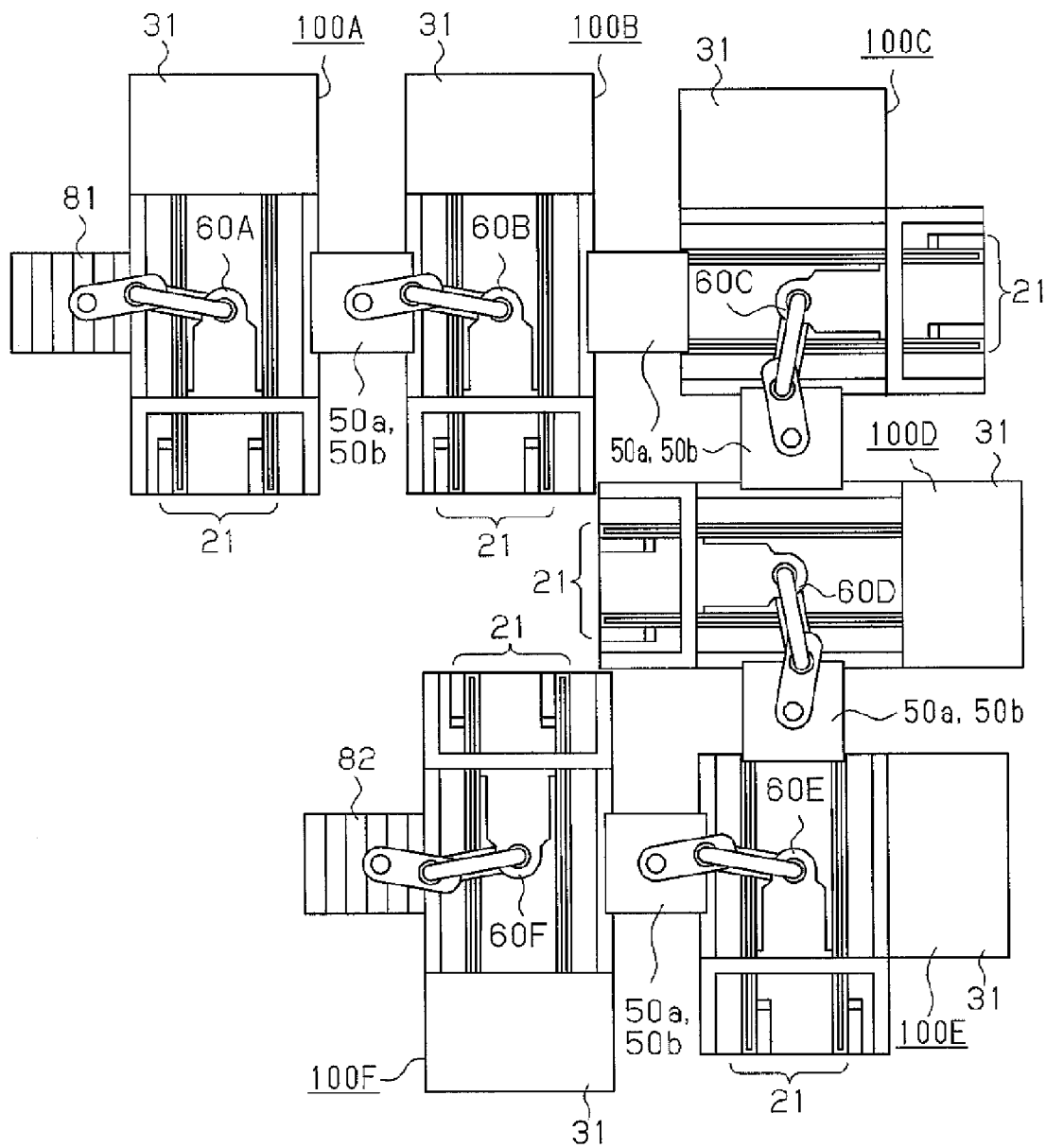
FIG. 9 is a plan view illustrating another example of the line configuration as the production system that uses a plurality of general-purpose cells of the embodiment.
Figure 10:
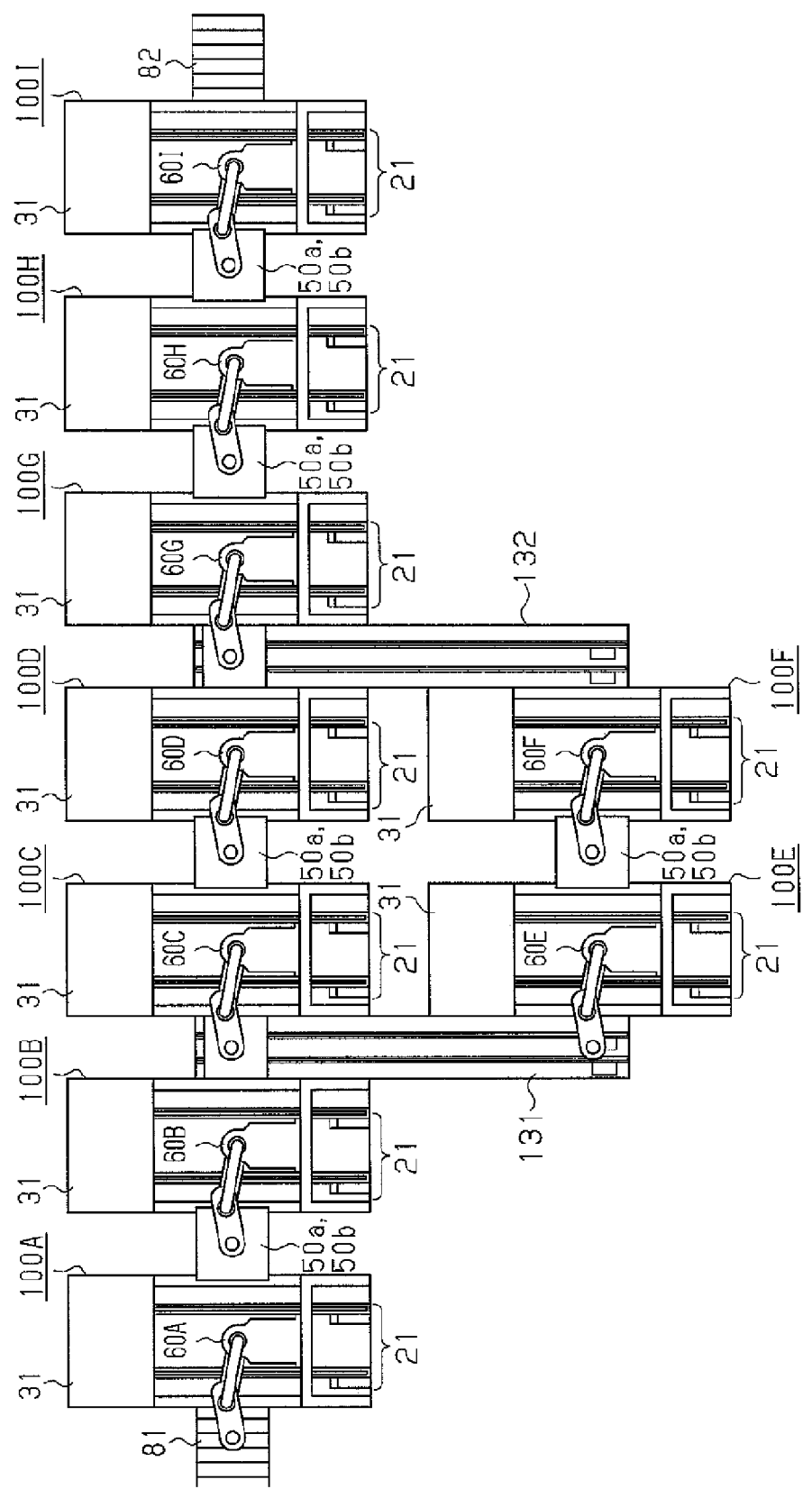
FIG. 10 is a plan view illustrating a still another example of the line configuration as the production system that uses a plurality of general-purpose cells of the embodiment.

FIGS. 9 and 10 illustrate other production line examples that support such a high degree of freedom of a line layout as the production system.

FIG. 9 illustrates an example in which an array of a plurality of general-purpose cells 100 (six general-purpose cells 100A to 100F in this example) is bent at two points in the middle by 90° to form a line layout in a "U" shape.

In other words, two cells, the general-purpose cell 100C and the general-purpose cell 100E, are designed to have a cell configuration where the stage (processing stage) 31 is disposed beside a base unit, and the material removal area 50b or the material supply area 50a as the common area of the cells adjacent to each other interposed in a portion where the stage 31 should have been disposed.

In this case, basic functions as each of the general-purpose cells 100A to 100F are the same as those of the aforementioned general-purpose cell 100.

Such a simple change of a cell configuration allows a line layout of this "U" shape as well as an "L" shape, and further a more complex shape.

Note that operations of each cell carried out under supervision and control by the central controller as the production system from the workpiece carrying-in device 81 to the workpiece carrying-out device 82 are basically the same as those exemplified in the FIG. 7 referenced above, and duplicate explanations are omitted here.

FIG. 10 illustrates an example further including workpiece automatic transportation units 131 and 132 in arranging a plurality of general-purpose cells 100 (nine general-purpose cells 100A to 100I in this case).

The workpiece automatic transportation units 131 and 132 each automatically transport a workpiece so as to enable, between such cells that motion ranges of robots in the cells are mutually unreachable, transferring and receiving of the workpiece within the motion ranges of the robots.

In this example, motion ranges of the robots 60B and 60E and the robots 60F and 60G do not cover the distances between the general-purpose cell 100B and general-purpose cell 100E and between the general-purpose cell 100F and general-purpose cell 100G, respectively.

In an ordinary way, transferring and receiving a workpiece between such cells is impossible.

However, providing the workpiece automatic transportation units 131 and 132 between cells allows a workpiece to be transferred and received between the cells concerned.

This in turn allows construction of a parallel line as illustrated in FIG. 10 with which workpieces can be separately transferred.

Therefore, it becomes possible to select a workpiece transportation path with a very high degree of flexibility including the workpiece automatic transportation units 131 and 132, and it becomes easy to adjust the line speed and the transportation timing in accordance with the processing contents of workpieces between cells.

Note that since the workpiece automatic transportation units 131 and 132 have constant transportation amounts (movement amounts) of workpieces, complex control and the like are not needed.

However, their configurations themselves may be equivalent, e.g., to those of the tray feeder 21 illustrated in FIG. 4 referenced above.

As described above, with a production system general-purpose cell and a production system using the general-purpose cell according to the embodiment, the effects listed in the following are obtained.

(1) One production system general-purpose cell 100 is configured as a set of minimum elements that are required for processing of a workpiece as a cell for a production system, such as the foregoing base unit 10, the parts supply unit 20, and the processing area 30.

This, as a matter of course, increases the degree of freedom, that is, the general versatility of task assignment for each cell 100.

It enables achievement of various production functions required for a production system only by placing the cells 100 configured in this way in sequence.

That is, the degree of freedom of a line layout in configuring a production system can be maintained high.

Further, the foregoing robot 60 is movably supported by the base unit 10 in a planar area forming a quadrangle.

This allows effective utilization of an area constituting the base unit 10, and eliminates unnecessary upsizing of the general-purpose cell 100.

(2) In the foregoing general-purpose cell 100, the application range of the processing area 30 expands since the processing area 30 extends outside the base unit 10 and the motion range of the robot 60 provided in the base unit 10 is set in a range from the inside to the outside the base unit 10 in a form including part of the processing area 30.

In addition, although the processing area 30 may be used, e.g., as an area for manual operations, the specific processing machine 70 is placed on the stage 31 constituting the processing area 30 in the foregoing general-purpose cell 100, significantly promoting standardization as a cell as well as automatization.

In other words, in this case, the robot 60 only has to basically carry out operations such as transporting a workpiece to the processing area 30 (the workpiece holding area 71 of the processing machine 70), picking up parts supplied through the parts supply unit 20, integrating the picked-up parts into a workpiece, and delivering the workpiece processed by the processing machine 70.

(3) The material feed and removal areas 50a and 50b used for at least one of feed of workpieces to the general-purpose cell 100 and removal of the workpieces from the general-purpose cell 100 further extend outside the foregoing base unit 10 in such a manner as to be included in a motion range of the robot 60.

This enables transportation of workpieces between cells to be performed through the material feed and removal areas 50a and 50b provided in a motion range of the robot 60, facilitating feed of workpieces to the general-purpose cell 100 and removal of the workpieces from the general-purpose cell 100 by a so-called bucket-brigade method.

(4) The foregoing base unit 10 is provided with a side wall 11 standing upright to the base unit 10, and the foregoing robot 60 is supported by the base unit 10 in such a manner that the robot 60 protrudes on the region 12 having a quadrangular planar shape of the base unit 10.

This facilitates securing an area required for the base unit 10, and particularly securing a motion range of a robot on a side of the foregoing processing area 30.

(5) The foregoing processing area 30 is configured such that the foregoing stage 31 extends in a table shape from the base unit 10 with a step at a position higher than the base unit 10, specifically the region 12, which has a quadrangular planar shape, of the base unit 10.

The foregoing parts supply unit 20 includes the tray feeder 21 that transports the parts tray Tr carrying workpiece parts from the back surface side of the side wall 11 through the base unit 10 to a lower portion of the table-like processing area 30.

In other words, parts carried on the parts tray Tr to be supplied are transported through the base unit 10 to a lower portion of the processing area 30, that is, a position lower than the processing area 30 by the tray feeder 21.

This allows operations such as operations of picking up the parts by the robot 60 protruding from the side wall 11 of the base unit 10 and operations of transporting the picked-up parts to the processing area 30 by the robot 60 to be carried out more smoothly, and also allows the whole of the table-like processing area 30 to be utilized more effectively.

In this case, the parts tray Tr can be sequentially moved to a lower portion of the processing area 30 (stage 31) in accordance with the motion range of the robot 60.

This enables employment of a larger or longer tray as the parts tray Tr.

(6) As the basic configuration of the foregoing general-purpose cell 100, the planar shape of the cell itself including the parts supply unit 20 and the processing area 30 as well as the base unit 10 is quadrangular.

The quadrangular planar shape of the cell itself including the parts supply unit 20 and the processing area 30 in this way enables, even in the case of using a plurality of general-purpose cells 100, uniform decision of arrangement of the general-purpose cell 100.

This in turn facilitates design of a line layout as the production system.

However, as in the general-purpose cell 100C and the general-purpose cell 100E exemplified in FIG. 9, the processing area 30 can extend beside the base unit 10.

In this case, a line layout in such a manner that a line is bent in the middle by ±90° as illustrated in FIG. 9 becomes possible.

(7) Regarding a production system using a general-purpose cell, a plurality of general-purpose cells 100 are arranged in such a manner that the cells adjacent to each other share part of the motion range of the robot 60.

Thus, pallets, conveyer belts, and the like for transporting a workpiece are, of course, unnecessary, and a high degree of freedom of a line layout itself is maintained.

This therefore enables achievement of a very free line layout, such as a linear arrangement of the cells as exemplified in FIG. 7 and an arrangement of a line bent in the middle by ±90° to form an "L" shape or a "U" shape as exemplified in FIG. 9 in accordance with a space for placing this production system, and the like.

(8) In constructing a production system, the workpiece automatic transportation units 131 and 132 are further included that each automatically transport a workpiece to enable, between such cells that motion ranges of robots in the cells are mutually unreachable in the ordinary way, transferring and receiving of the workpiece within the motion ranges of the robots.

This allows a more wide variety of line layouts such as making part or the whole of a line in a parallel manner using the workpiece automatic transportation units 131 and 132, in addition to the line layouts described above, and also facilitates adjustment of the line speed and adjustment of the transportation timing in accordance with processing contents of workpieces between cells.

Second Embodiment

Figure 11:
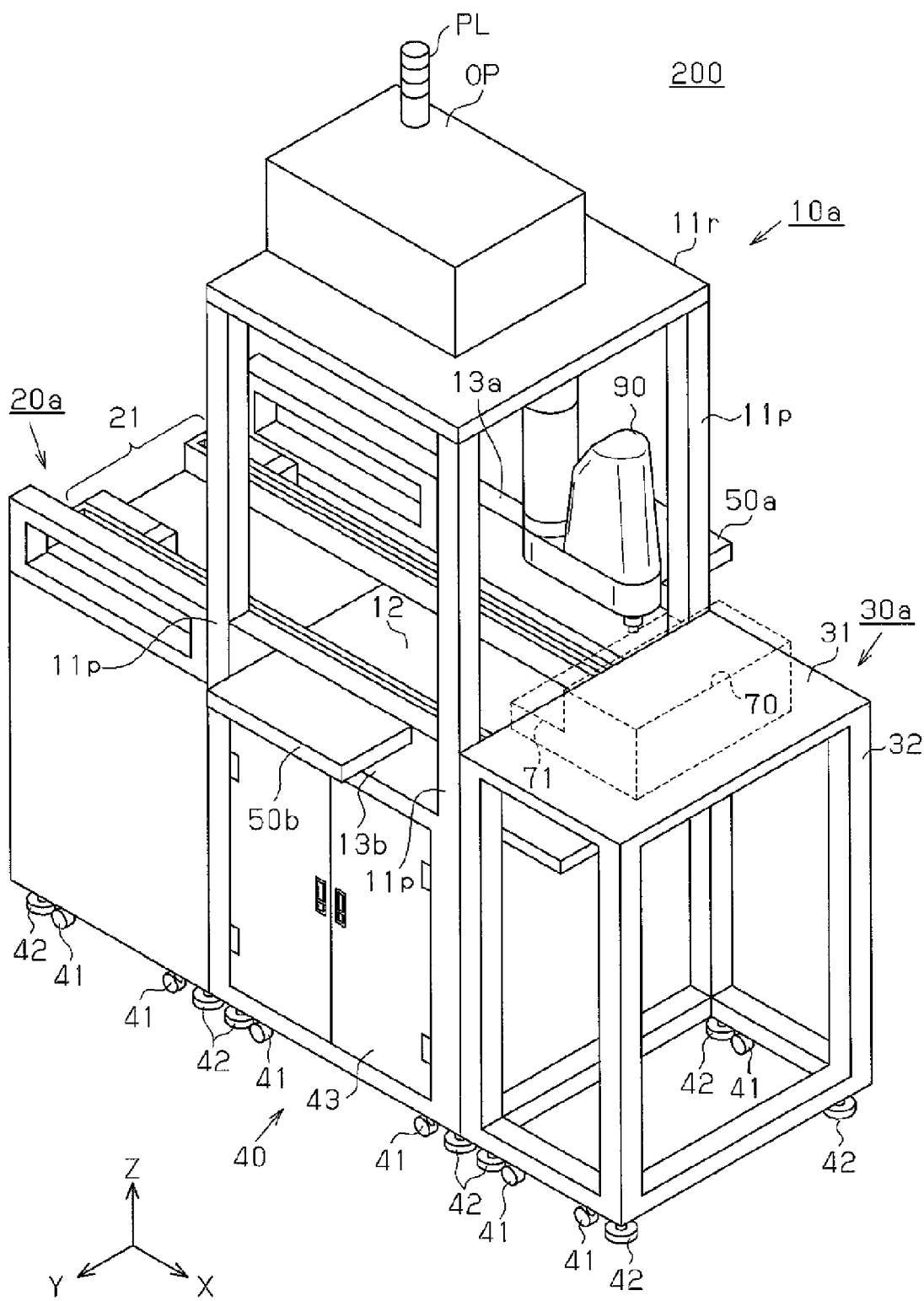
FIG. 11 is a perspective view illustrating an entire perspective configuration of a second embodiment of a production system general-purpose cell according to the invention.

FIG. 11 illustrates a perspective configuration of a second embodiment of a production system general-purpose cell according to the invention.

In the second embodiment, a form of supporting a robot to a base unit is changed from the above-mentioned form of a robot protruding from a side wall to a form of so-called ceiling-hung.

A specific configuration of the general-purpose cell will be described below focusing on differences from the first embodiment described above.

As illustrated in FIG. 11, a general-purpose cell 200 according to the present embodiment includes a base unit 10a, which supports a robot 90, positioned at the center, and a parts supply unit 20a and a processing area 30a both disposed along the direction of the X axis of three dimensional coordinates added in the figure.

In the embodiment, as in the first embodiment, the base unit 10a, the parts supply unit 20a, and the processing area 30a constituting the general-purpose cell 200 are all made of metal having rigidity and are mutually suitably connected, and can be moved and placed in blocks of cell by using casters 41 and foot jacks 42 attached onto a bottom surface 40 of the general-purpose cell 200.

Additionally, in the embodiment, as in the first embodiment, the planar shapes of the base unit 10a and the general-purpose cell 200 itself are quadrangular (rectangular).

Such shapes facilitate a line layout design for a production system using a plurality of general-purpose cells 200.

Just as in the first embodiment, in the general-purpose cell 200, a cabinet 43 is disposed in a lower portion of the base unit 10a, and a control device, which supervises and controls the foregoing robot 90 and other units of the general-purpose cell 200, and the like are contained in the cabinet 43.

Here, the specific configuration of the above base unit 10a will first be described.

As illustrated in FIG. 11, in the base unit 10a, a ceiling 11r supported by supports 11p is disposed, and the aforementioned robot (SCARA type robot in this example, as in the example of the first embodiment) 90 is supported by the base unit 10a in such a form that the robot 90 is hung from the ceiling 11r.

That is, the robot 90 is supported by the base unit 10a, accurately the ceiling 11r, in such a manner as to be movable in the X, Y, and Z axis directions of three dimensional coordinates on a region 12 having a quadrangular planar shape, which is a top surface of the base unit 10a.

In the embodiment, a material supply area 50a serving as a unit of supplying a workpiece to the cell 200 and a material removal area 50b serving as a unit of removing the workpiece from the cell 200 extend from side plates 13a and 13b disposed on both sides of the region 12 to both sides (Y direction) of the base unit 10a, respectively, in such a manner as to be within the motion range of the robot 90 described above.

Figure 12A:
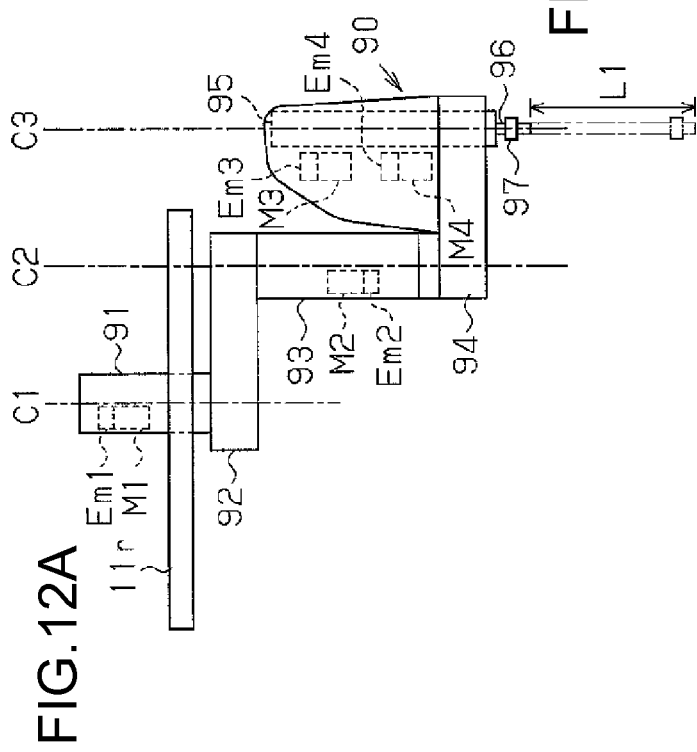
FIG. 12A illustrates a side configuration of a robot employed for the general-purpose cell of the second embodiment.
Figure 12B:
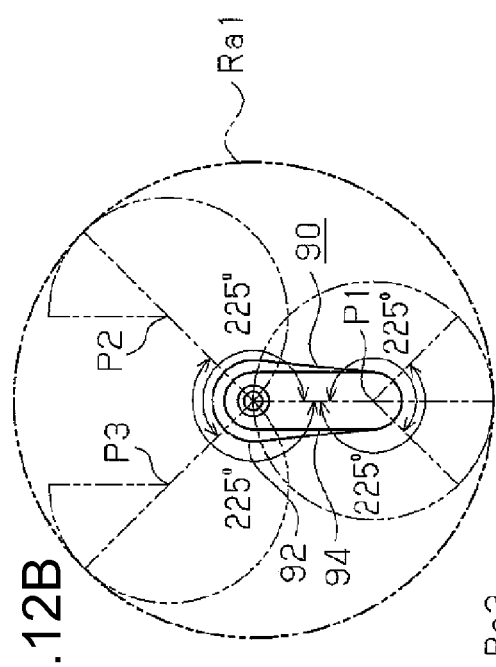
FIGS. 12B to 12D are bottom views each schematically illustrating one example of motion modes and motion ranges seen from the below.
Figure 12D:
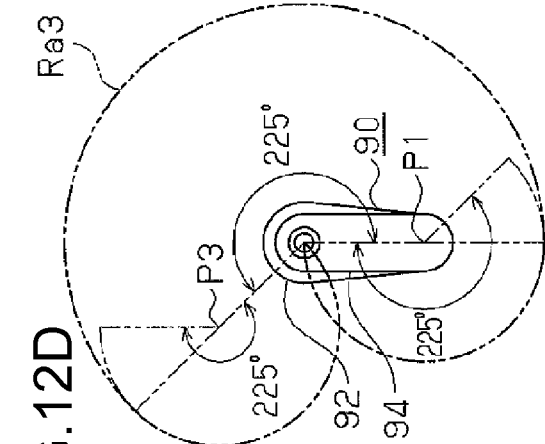
Figure 12C:
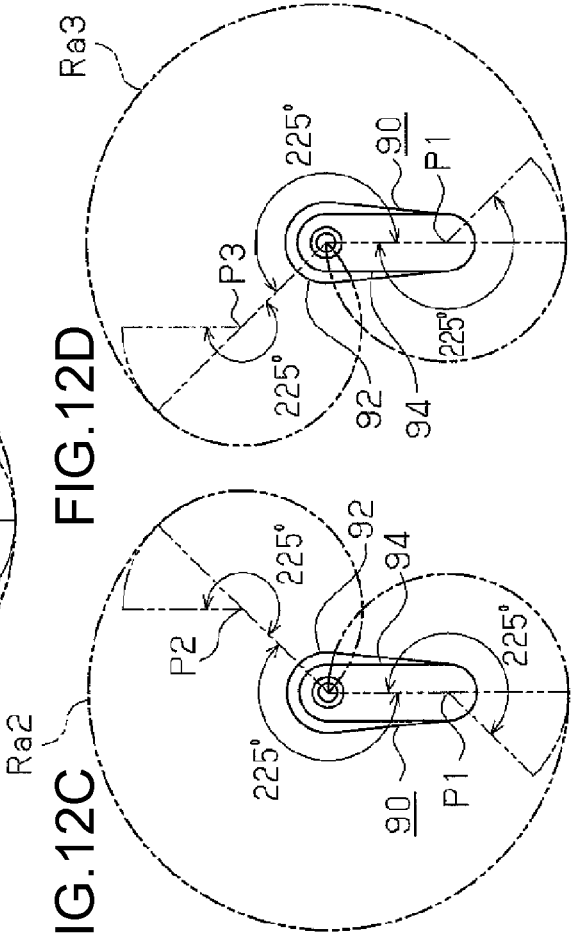

FIG. 12A illustrates a side configuration of the robot 90, and FIGS. 12B to 12D illustrate motion modes and motion ranges seen from the below.

Further details of the configuration and functions of the robot 90 are described in the following with reference to FIGS. 12A to 12D.

As illustrated in FIG. 12A, the robot 90 is supported by a first shaft 91 disposed passing through the ceiling 11r and extending from the ceiling 11r into the vertical direction, and has first and second arms 92 and 94 that are separately turnable in a horizontal direction through the first shaft 91 and a second shaft 93, respectively.

In an edge of the second arm 94 among these components, a third shaft 95 extending in the same direction (vertical direction) as those of the first and second shafts 91 and 93 is further provided. In the third shaft 95, a head unit 96, which is rotatable in a horizontal direction independently from the turn of the second arm 94, is disposed in a portion positioned below the second arm 94.

The head unit 96 has, in an edge thereof, a tool fixture 97.

With an arbitrary tool attached to the tool fixture 97, the head unit 96 can freely expand and contract between a position where it is contained in the third shaft 95 (the shortest position) and a position where it extends for a distance L1 indicated by a dotted line in FIG. 12A (the longest position).

Note that the first shaft 91 rotates right and left around a center line C1 of the a first motor M1, which is provided inside the first shaft 91, by the first motor M1 to cause the first arm 92 with an edge thereof connected to the first shaft 91 to turn.

The rotation angle of the first shaft 91, that is, the turning angle of the first arm 92 is monitored through a first encoder Em1 disposed, like the first motor M1, in the first shaft 91.

The second shaft 93 rotates right and left around a center line C2 of the a second motor M2, which is provided inside the second shaft 93, by the second motor M2 to cause the second arm 94 with an edge thereof connected to the second shaft 93 to turn.

The rotation angle of the second shaft 93, that is, the turning angle of the second arm 94 is monitored through a second encoder Em2 disposed, like the second motor M2, in the second shaft 93.

The head unit 96 that rotates, expands and contracts in the third shaft 95 rotates right and left around a center line C3 of the third shaft 95 by a third motor M3 disposed in the second arm 94, and the rotation angle is monitored through a third encoder Em3 disposed, like the third motor M3, in the second arm 94.

On the other hand, regarding expansion and contraction of the head unit 96, the degree of the expansion and contraction is controlled by an elevating motor M4 disposed in the second arm 94, and the controlled degree is monitored through an elevating encoder Em4 disposed, like the elevating motor M4, in the second arm 94.

Note that signal lines of control signals and monitor signals of these motors and encoders are coupled to the corresponding terminals of a control device contained in the cabinet 43, just as in the first embodiment.

Regarding the robot 90, the first and second arms 92 and 94 are set in the same length so that their motion areas are basically circular and they can each pass the overlapping positions.

With the collaboration of these arms, motions in the whole of a circular area illustrated as a motion range Ra1 in FIG. 12B are covered.

That is, FIG. 12B illustrates a state of the robot 90, as seen from the below, in a so-called original attitude with the first and second arms 92 and 94 overlapping each other in a "U" shape.

In the embodiment, in this state, the second arm 94 is turnable clockwise and counterclockwise about a point P1 by 225°, and similarly the first arm 92 is independently turnable about the center point in FIG. 12B to cause the point P1 to swing clockwise and counterclockwise by 225°.

In this respect, FIG. 12C illustrates the turning locus, that is, a motion range Rat of the first and second arms 92 and 94.

If the first arm 92 causes the second arm 94 to swing clockwise by 225°, the second arm 94 can turn clockwise and counterclockwise about the point P1 and *a point P2 by 225°.

Likewise, FIG. 12D illustrates the turning locus, that is, a motion range Ra3 of the first and second arms 92 and 94.

If the first arm 92 caused the second arm 94 to swing counterclockwise by 225°, the second arm 94 can turn clockwise and counterclockwise about the point P1 and a point P3 by 225°.

The combined turning loci are illustrated in FIG. 12B.

After all, as described above, with the collaboration of the first and second arms 92 and 94, motions in the whole of a circular area illustrated as a motion range Ra1 in FIG. 12B are covered.

Note that, in the embodiment, the head unit 96 is turnable clockwise and counterclockwise by 225° independently from the second arm 94.

With such motions of the robot 90, all dead angles at least on the base unit 10a, accurately on the region 12 of a quadrangular planar shape, are eliminated.

Therefore, regarding the general-purpose cell 200 illustrated in FIG. 11, transportation of the workpiece and picking up of parts carried on the parts tray (not illustrated) that is transported by the tray feeder 21 of the parts supply unit 20a, which have been described above, are carried out more smoothly.

Note that, in the general-purpose cell 200 illustrated in FIG. 11, an operating panel OP having a keyboard and a display for monitoring (all not illustrated) is provided on the top of the ceiling 11r of the base unit 10a.

Through this operating panel OP, various settings required for each cell can be made.

A status indicator PL placed on the operating panel OP is a device that informs an operator and the like of the operating status and other statuses of the general-purpose cell 200, as occasion demands, with luminescent units of different colors.

The aforementioned other items described with reference to FIGS. 3 to 6 in the general-purpose cell according to the embodiment, that is, the basic configuration as the tray feeder 21, the relationship with the stage (processing stage) 31, an electrical construction inside the cell, operations of the cell in collaboration with the processing machine 70, etc., are basically the same as those in the first embodiment.

Construction of a production system using a plurality of general-purpose cells exemplified in FIGS. 7 to 10, modifications thereof, and the like are basically feasible with ease in the same or equivalent manner as those in the first embodiment.

As described above, with a production system general-purpose cell and a production system using the general-purpose cell according to the embodiment, the same or equivalent effects as those in the aforementioned (1) to (8) in the first embodiment are obtained.

Among such effects, particularly the effect (4) is further promoted, resulting in obtainment of the following effects.

(9) The ceiling 11r supported with columns 11p is provided in an upper portion of the base unit 10a, and the robot 90 is supported in the base unit 10a in such a manner that the robot 90 is hung from the ceiling 11r.

This allows the motion range of the robot 90 to cover a wide range including the whole area below the ceiling 11r.

In particular, an area constituting the base unit 10a is utilized more effectively.

(10) In particular, the robot 90 has the first and second arms 92 and 94 having the same length that allows the first and second arms 92 and 94 to have their individual circular motion areas and each pass the overlapping positions.

A SCARA type robot is employed in which the first and second arms 92 and 94 are turnable clockwise and counterclockwise by 225° with an attitude of the arms overlapping each other taken as the original attitude.

This enables the motion range of the entire robot 90 to be basically circular and cover the entire area inside the circle with the collaboration of the first and second arms 92 and 94.

That is, in the motion range of the robot 90 set from the inside to the outside of the base unit 10a, dead angles at least in the base unit 10a are eliminated with reliability.

For example, more smooth motions in operations of picking up parts from a parts tray can be expected.

(11) Thus, an area constituting the base unit 10a is utilized more effectively, and a parts tray transported by the tray feeder 21 constituting the parts supply unit 20 can be upsized as dead angles of the robot 90 in the same area are eliminated.

That is, the number of parts that can be supplied at one time to the general-purpose cell 200 can be increased, and the frequency of operations required for supplying parts by the tray feeder 21 constituting the parts supply unit 20 can be reduced.

Other Embodiments

Note that the foregoing embodiments may be practiced in the following ways.

Although the side wall 11 to support the robot 60 is provided standing upright to the base unit 10 from the base portion side of the parts supply unit 20 particularly in the foregoing first embodiment, the side wall 11 may be provided standing upright at a midpoint of the base unit 10 if it is expected that there is room for space in the base unit 10.

In brief, the side wall 11 may be provided, in balance with the motion range, to be separate from the processing area 30 so that the motion range of the robot 60 reaches at least part of the processing area 30.

In this way, if the rail length of the tray feeder 21 constituting the parts supply unit 20 is reduced, the size of the general-purpose cell 100 itself may be reduced.

On the other hand, in the foregoing second embodiment, the first and second arms 92 and 94 constituting the robot 90 are set such that they can turn from their original attitudes clockwise and counterclockwise, that is, in the "±" direction at a turnable angle of "225°".

However, by setting the turnable angles to be "±180°" or more, the whole area inside a circle exemplified in FIG. 12B can be covered such that dead angles are eliminated with reliability.

The turnable angle of the first and second arms 92 and 94 is not limited to be "±180°" or more, but may each be set to be less than "±180°" if the required motion range is secured.

In the foregoing second embodiment, regarding the tray feeder 21 constituting the parts supply unit 20a, a cell configuration is employed that allows parts that are supplied while being carried on the parts tray to be transported through the base unit 10a to a lower portion of the processing area 30, that is, a position lower than the stage 31, as in the first embodiment.

In the second embodiment, however, the robot 90 is supported in such a manner that it is hung from the ceiling 11r, and therefore there is basically no portion to block the movement of the parts tray.

Accordingly, the degree of freedom in arrangement of the tray feeder 21 is, as a matter of course, maintained high.

The tray feeder 21, in this case, may be one that can transport the foregoing parts tray through the base unit 10a to a vicinity of the processing area 30a (stage 31).

That is, a step and the like need not to be provided between the region 12 of a quadrangular planar shape and the stage 31 constituting the processing area 30a in the base unit 10a.

Even with this, operations of picking up appropriate parts by the robot 90 and operations of transporting the picked-up parts to the processing area 30a by the robot 90 are carried out smoothly.

In addition, in the case of the second embodiment, the motion range of the robot 90 broadly covers the transportation area including the parts tray to be transported to the base unit 10a.

This therefore allows reduction of the frequency of operations required for supplying parts by the tray feeder 21 by upsizing the parts tray itself.

Although a mechanism that has ball screws and nails threadably engaged therewith and automatically transports a tray and the like is employed as the tray feeder 21 constituting the parts supply units 20 and 20a or as the workpiece automatic transportation units 131 and 132 in the foregoing embodiments, the transportation mechanism is not limited to this and may be configured arbitrarily.

As such a unit, for example, other mechanisms that electromagnetically induce and move transportation subjects may also be employed as appropriate.

Although the tray feeder 21 constituting the parts supply unit 20 or 20a drives two rails 22a and 22b by the first and second shuttle motors MSa and MSb in the foregoing embodiments, both the rails 22a and 22b may be driven by one shuttle motor.

The tray feeder 21 may also include one rail.

Although the tray feeder 21 constituting the parts supply unit 20 or 20a transports the parts tray Tr by driving two rails 22a and 22b together in the foregoing embodiments.

However, this is not restrictive.

If the rails 22a and 22b are individually driven to alternately transport the parts trays having such sizes that they do not interfere each other by the respective rails 22a and 22b, supplying parts to the cells 100 and 200 can be performed smoothly.

Although an electrical connection is made through a communication line as exemplified in FIG. 8 in configuring a production system using a plurality of general-purpose cells in the foregoing embodiments, the communication form is arbitrary regardless of wire communication or radio communication.

An equivalent communication network may be established using either the cell 100 or the cell 200, intentionally without the central controller 120.

Although the specific processing machine 70 is placed for the processing area 30 or 30a and processing of a workpiece is performed by the processing machine 70 in the foregoing embodiments, the uses of the processing area 30 or 30a and the robot 60 or 90 are arbitrary in each general-purpose cell.

For example, these processing area and robot may be utilized in the following ways.

(A) Only a mechanism and the like for holding transported workpieces are provided in a processing area, and a robot itself carries out all operations including processing of workpieces.

That is, in this case, the robot carries out the following operations:
 a. transporting a workpiece to the processing area;
 b. picking up parts supplied through a parts supply unit;
 c. integrating the picked-up parts into the workpiece;
 d. processing in the above processing area the workpiece into which the parts have been integrated; and
 e. delivering the workpiece processed in the processing area.

Additionally, in this case, the content of processing for the robot to carry out needs to be set (programmed) for each cell in configuring a production system in a sequence of the cells mentioned above.

If the set content is registered into a storage device such as the data base 122 (FIG. 8) in advance, for example, changes in line configuration can be handled by updating the set content for each cell.

That is, the required general versatility is maintained in this case.

(B) An automatic tool changer that automatically replaces a hand (tool) of a robot with a new one is provided in the processing area, and the robot itself carries out all operations including automatic replacement of tools and processing of workpieces.

That is, in this case, the robot carries out the following operations:
 a. picking up parts supplied through a parts supply unit;
 b. integrating the picked-up parts into the workpiece;
 c. processing in the above processing area the workpiece into which the parts have been integrated;
 d. delivering the processed workpiece; and
 e. automatic replacement of a robot hand, as needed, for the operations a to d by means of the foregoing automatic tool changer.

Particularly in this case, automatic replacement of a robot hand, as needed, by means of the automatic tool changer provided in the processing area is carried out as the operation of the above e together with other operations, and therefore more kinds of operations can be handled.

In this case, when a production system is configured in a sequence of the above cells, the content of processing for the robot to carry out needs to be set (programmed) for each cell.

However, the required general versatility as the cell is preferably maintained by registering the set content into a storage device such as the data base 122 (FIG. 8) in advance.

That is, in changing the line configuration, it can be handled by updating the set content for each cell.

Although SCARA type robots are employed as the robots 60 and 90 in the foregoing embodiments, the type of the robot is arbitrary particularly in the uses as the above (A) and (B).

Other types of robots such as one having a function like a "human hand" may be employed as appropriate.

Although examples in which processing areas 30 and 30a are integrally connected to the base units 10 and 10a are taken in the foregoing embodiments, the processing areas 30 and 30a constituting the general-purpose cells 100 and 200 may be configured as separate, replaceable bodies extending outside the base units 10 and 10a, respectively.

In this case, the effect of suppressing transmittance of vibration between the processing areas 30 and 30a and the base unit 10 and 10a, respectively, can be expected.

As a result, an inspection by an inspection device that is likely to be affected by vibration can be preferably performed in the processing area.

Further, in this case, arrangement of a cell configuration as in the general-purpose cells 100C and 100E exemplified in FIG. 9 referenced above is facilitated, and, in turn, the degree of freedom of a line layout as illustrated in FIG. 9 is further increased.

That is, it is necessary for a production system general-purpose cell that one general-purpose cell is constituted of a set of minimum elements such as a base unit, a parts supply unit, and a processing area required for processing of a workpiece as a cell for a production system.

From this viewpoint, providing the aforementioned material supply area 50a and the material removal area 50b are not essential for the general-purpose cell.

For example, if a workpiece can be transferred between robots in the cells adjacent to each other, the material supply area 50a and the material removal area 50b may be not provided.

What is claimed is:

1. A production system general-purpose cell comprising:
 a base unit having a planar area and supporting at least a robot movable on the planar area;
 a parts supply unit for supplying parts to the robot; and
 a processing unit having a processing area extending outside the base unit;
 a first caster enabling the base unit to move;

a second caster enabling the processing unit to move; and the robot supported by the base unit having a motion range set in a range from inside to outside the base unit in a form including at least part of the processing area.

2. The production system general-purpose cell according to claim 1, wherein:

a side wall standing upright to the base unit is provided separately from the processing area in the base unit; and the robot is supported by the base unit in such a manner that the robot protrudes from the side wall.

3. The production system general-purpose cell according to claim 1, wherein:

a ceiling supported through a support is provided in an upper portion of the base unit; and the robot is supported by the base unit in a manner of being hung from the ceiling.

4. The production system general-purpose cell according to claim 3, wherein the robot is of a SCARA type robot including first and second arms each having a motion area of one of a circle and a circular arc, the second arm being passable through a position overlapping the first arm.

5. The production system general-purpose cell according to claim 1, wherein the base unit, supply unit, and processing unit are independently movable relative to one another.

6. The production system general-purpose cell according to claim 5, wherein the base unit, supply unit, and processing unit are configured to be mutually connected to each other.

\* \* \* \* \*